US009123840B2

(12) United States Patent
Komoda et al.

(10) Patent No.: US 9,123,840 B2
(45) Date of Patent: Sep. 1, 2015

(54) SOLAR CELL ELEMENT MANUFACTURING METHOD, SOLAR CELL ELEMENT, AND SOLAR CELL MODULE

(75) Inventors: Manabu Komoda, Omihachimanshi (JP); Yasuhiro Okada, Yasu (JP); Yuusuke Nagou, Higashiomi (JP); Takeshi Ito, Higashiomi (JP); Hitohiko Nakamura, Yasu (JP)

(73) Assignee: KYOCERA Corporation, Kyoto (JP)

( * ) Notice: Subject to any disclaimer, the term of this patent is extended or adjusted under 35 U.S.C. 154(b) by 66 days.

(21) Appl. No.: 13/982,230

(22) PCT Filed: Jan. 27, 2012

(86) PCT No.: PCT/JP2012/051757
§ 371 (c)(1),
(2), (4) Date: Jul. 26, 2013

(87) PCT Pub. No.: WO2012/102368
PCT Pub. Date: Aug. 2, 2012

(65) Prior Publication Data
US 2014/0000675 A1 Jan. 2, 2014

(30) Foreign Application Priority Data

Jan. 27, 2011 (JP) .................................. 2011-014715
Feb. 28, 2011 (JP) .................................. 2011-042196

(51) Int. Cl.
*H01L 21/00* (2006.01)
*H01L 31/0352* (2006.01)
(Continued)

(52) U.S. Cl.
CPC ...... *H01L 31/0352* (2013.01); *H01L 31/02363* (2013.01); *H01L 31/068* (2013.01); *Y02E 10/547* (2013.01)

(58) Field of Classification Search
CPC ............ H01L 31/02363; H01L 31/068; H01L 31/042; H01L 31/047; H01L 31/046; H01L 31/0352; H01L 31/02021; H01L 31/02167
USPC ........ 438/57, 58, 66, 689, 701, 704; 136/244, 136/256
See application file for complete search history.

(56) References Cited

U.S. PATENT DOCUMENTS

2002/0050289 A1* 5/2002 Wada et al. .................... 136/256
2008/0041823 A1* 2/2008 La et al. .......................... 216/97
(Continued)

FOREIGN PATENT DOCUMENTS

JP   2003-258285 A   9/2003
JP   2003-309276 A   10/2003
(Continued)

OTHER PUBLICATIONS

International Search Report dated May 1, 2012, issued for International Application No. PCT/JP2012/051757.

*Primary Examiner* — Brook Kebede
(74) *Attorney, Agent, or Firm* — Procopio, Cory, Hargreaves & Savitch LLP

(57) ABSTRACT

A method for manufacturing a solar cell element is disclosed. The method includes two different etching processes followed by forming a semiconductor layer. A semiconductor substrate having a first conductor type is etched by using a first acid aqueous solution containing hydrofluoric acid, nitric acid, and sulfuric acid. Then, the semiconductor substrate is etched by using a second acid aqueous solution containing hydrofluoric acid and nitric acid with substantially no sulfuric acid to make an uneven surface. A semiconductor layer of second conductivity type different from the first conductivity type is formed on at least a part of the uneven surface of the semiconductor substrate.

6 Claims, 15 Drawing Sheets

(51) Int. Cl.
*H01L 31/0236* (2006.01)
*H01L 31/068* (2012.01)

(56) References Cited

U.S. PATENT DOCUMENTS

2010/0059847 A1* 3/2010 Nasuno et al. ............... 257/458

2011/0240997 A1* 10/2011 Rockenberger et al. ......... 257/49

FOREIGN PATENT DOCUMENTS

| JP | 2005-129714 A | 5/2005 |
| JP | 2005-311060 A | 11/2005 |
| JP | 2005-340643 A | 12/2005 |

* cited by examiner

SOLAR CELL ELEMENT MANUFACTURING METHOD, SOLAR CELL ELEMENT, AND SOLAR CELL MODULE

FIELD OF ART

The present invention relates to a solar cell element manufacturing method, a solar cell element, and a solar cell module.

BACKGROUND ART

Forming an uneven part on a surface of a silicon substrate in a solar cell element including a silicon substrate reduces the reflection of light at the light-receiving surface.

A method for forming an uneven part on the surface of a silicon substrate is, for example, a method for using an acid aqueous solution containing at least hydrofluoric acid and nitric acid, and subjecting the surface of a silicon substrate having a damaged layer to etching treatment (refer to, for example, Patent Reference 1).

In this case, the damaged layer on the surface of the silicon substrate is usually formed when a wire saw apparatus is used to slice a silicon ingot thinly to obtain silicon substrates. The wire saw apparatuses used include a free abrasive type and a fixed abrasive type. With the free abrasive type of apparatus, by supplying a cutting fluid containing an abrasive, the silicon ingot is sliced thinly by the lapping action of the wire. With the fixed abrasive type of apparatus, the silicon ingot is thinly sliced by a wire (also called an abrasive-bearing wire) to which an abrasive has been fixed beforehand.

In a solar cell element including a silicon substrate, the silicon substrate includes many metallic elements. The metallic elements are a typical factor in worsening the characteristics of the solar cell element. Transition metallic elements such as iron and copper in particular worsen the output characteristics of a solar cell element. For this reason, the reduction of the worsening of the characteristics of a solar cell element attributed to the existence of metallic elements in the silicon substrate is essential in improving the conversion efficiency of the solar cell element.

Given the above, a technique is necessary in subsequent processes to reduce the influence of metallic elements mixed in the silicon substrate. One known technique is the so-called gettering technique.

Gettering is a technique of moving impurity elements from a region in which the main function of the device is exhibited (also called the device region) to a region other than that region for fixing them. For example, in the case of a solar cell element, by gettering, impurity elements are moved from the device region, which mainly includes an photoactive region and a junction region, to a region other than that region. A typical example of gettering is the gettering of metallic elements by phosphorus diffusion.

For example, a method for manufacturing a solar cell has been disclosed (refer to, for example, Patent Reference 2), wherein, when a pn junction region is formed by thermal diffusion of phosphorus, a layer into which phosphorus has diffused (also called a phosphorus diffusion layer) is used, and the gettering effect acts to improve the characteristics of the solar cell element.

PRIOR ART REFERENCES

Patent References

Patent Reference 1: Japanese Unexamined Patent Application Publication (Published Japanese Translation of PCT Application) 2005-340643

Patent Reference 2: Japanese patent application publication 2005-129714

SUMMARY OF THE INVENTION

Problem to be Solved by the Invention

In a semiconductor substrate including a shallow damaged layer, even if the surface of the silicon substrate is subjected to the etching treatment by an acid aqueous solution disclosed in the Patent Reference 1, there are cases in which an uneven part might not be uniformly formed on the surface of the silicon substrate. Given this, to improve the output characteristics of the solar cell element, even in a semiconductor substrate including a shallow damaged layer, it is desirable to have a solar cell element manufacturing method that forms a preferred uneven part on the surface of a silicon substrate by etching treatment using an acid aqueous solution.

The manufacturing method disclosed in the Patent Reference 2 thermally diffuses phosphorus into the surface of the silicon substrate, forming a PSG (phosphorus silicate glass) layer and a phosphorus diffusion layer. An acid treatment then removes the PSG layer, thereby removing the metal impurities included in the PSG layer. Additionally, the residual phosphorus diffusion layer is used and heat treatment done again to perform gettering of metal impurities. Then, the surface layer of the silicon substrate that includes the phosphorus diffusion layer is removed. In this manner, the manufacturing method disclosed in the Patent Reference 2 requires a large number of processes, which can lead to an increase in the manufacturing cost. Solar cell elements, however, require a reduction in manufacturing cost. For this reason, there is a desire for a method for manufacturing a solar cell element having good output characteristics and manufactured with good efficiency.

Therefore, the first object of the present invention is to achieve a solar cell element having good output characteristics. The second object of the present invention is to achieve a solar cell element having good output characteristics by forming a preferred uneven part on the surface of a silicon substrate. The third object of the present invention is to achieve a solar cell element having good output characteristics with a low manufacturing cost.

Means for Solving the Problem

A solar cell element manufacturing method according to an embodiment of the present invention includes: an uneven part forming step of forming an uneven part on a first main surface of a first conductivity type semiconductor substrate by subjecting the first main surface to etching treatment using an acid aqueous solution; and a semiconductor layer forming step of forming in a region of the first main surface side of the semiconductor substrate a semiconductor layer having a second conductivity type that is the opposite conductivity type of the first conductivity type. The uneven part forming step includes: a first etching step of subjecting the first main surface of the semiconductor substrate to a first etching treatment by a first acid aqueous solution containing hydrofluoric acid, nitric acid, and sulfuric acid; and a second etching step, following the first etching step, of subjecting the first main surface of the semiconductor substrate to a second etching treatment by a second acid aqueous solution containing hydrofluoric acid and nitric acid and also substantially not containing sulfuric acid.

A solar cell element manufacturing method according to another embodiment of the present invention includes: a lamination part forming step of using thermal diffusion to form a second conductivity type semiconductor layer in a region of a first main surface side of a first conductivity type semiconductor substrate, having a conductivity type that is the opposite of the first conductivity type and to form a glass layer that contains an element serving as a dopant of the second conductivity type and that is disposed on the semiconductor layer; and a glass layer removal step of removing the glass layer using hydrofluoric acid and hydrochloric acid.

Effect of the Invention

A solar cell element manufacturing method according to the above-described embodiment forms a preferred uneven part on the surface of a semiconductor substrate. As a result, a solar cell element having good output characteristics is achieved.

A solar cell element manufacturing method according to the other above-described embodiment achieves, by low-cost manufacturing, a solar cell element having good output characteristics.

EMBODIMENTS FOR CARRYING OUT THE INVENTION

Figure 1:
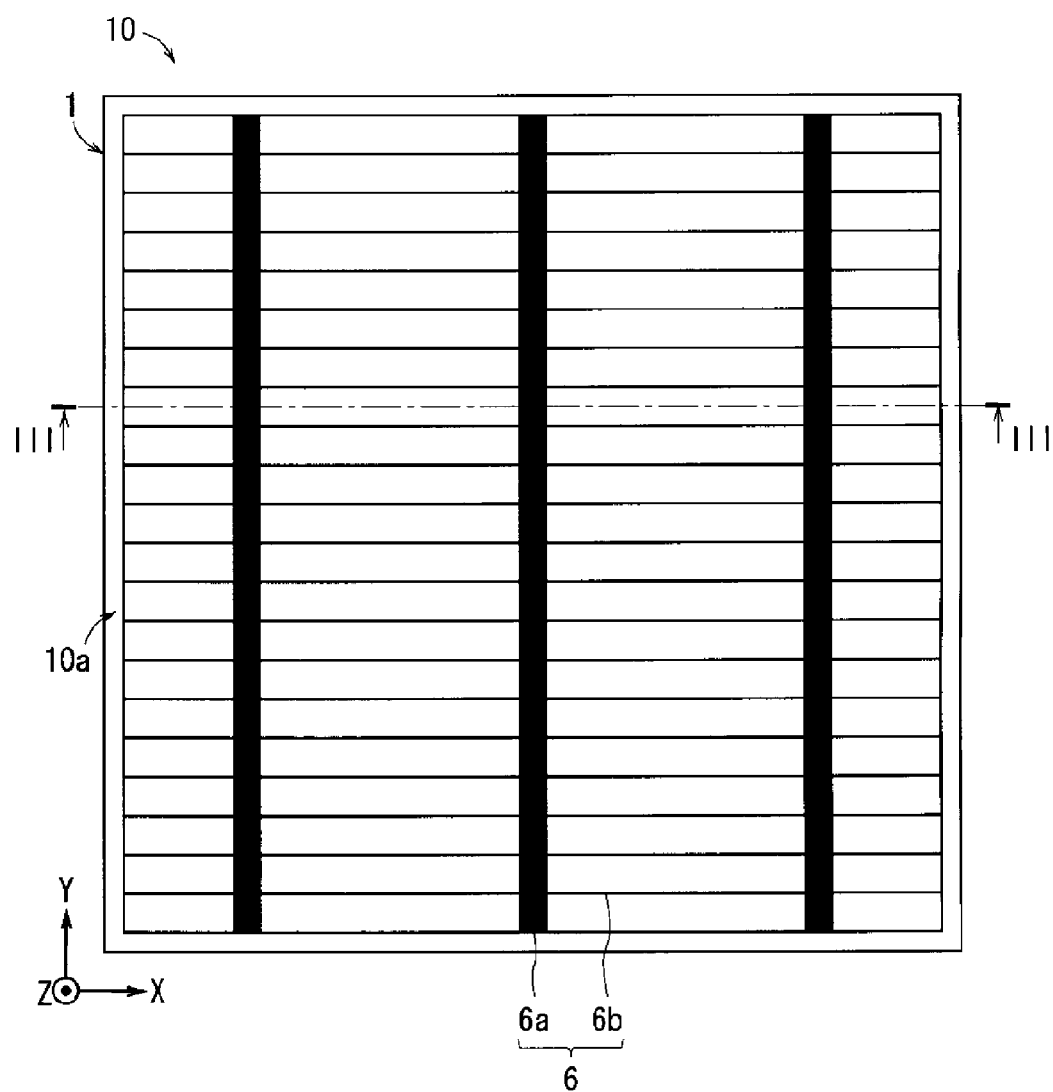
FIG. 1 is a plan view schematically showing an outer appearance of a first main surface of a solar cell element according to an embodiment.

Embodiments and a variety of variations thereof of the present invention are described below, based on the drawings. In the drawings, parts having the same constitutions and functions are assigned the same reference numerals, and repeated descriptions thereof have been omitted in the following descriptions. The drawings are schematically illustrated, and the sizes and positional relationship and the like of various structures in the various drawings are not shown precisely. FIG. 1 to FIG. 5 show a right-hand XYZ coordinate system, in which the direction of extension of the first output lead-out electrodes 6a (upward when viewing FIG. 1) is taken to be the Y direction.

(1) SOLAR CELL ELEMENT

Figure 2:
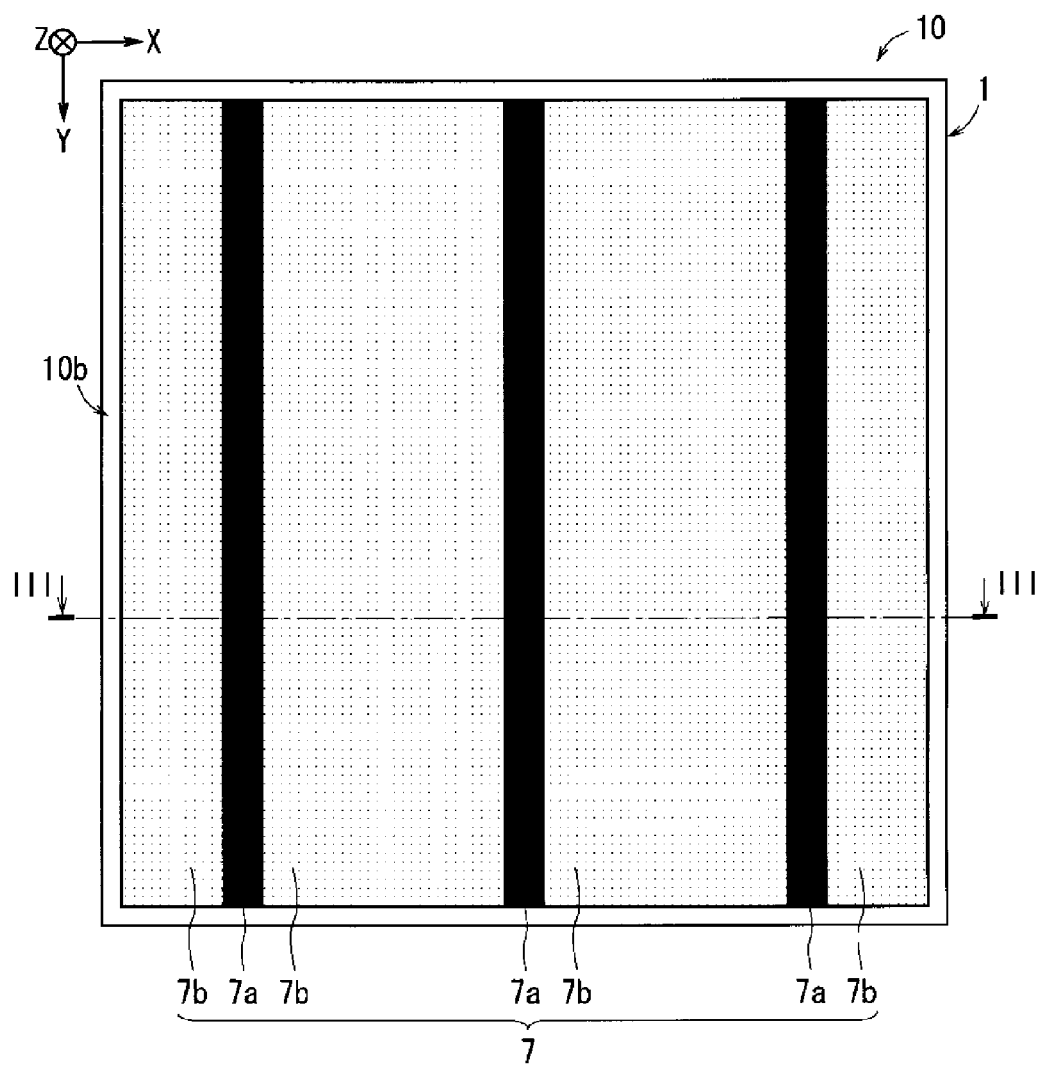
FIG. 2 is a plan view schematically showing an outer appearance of a second main surface of the solar cell element shown in FIG. 1.
Figure 3:
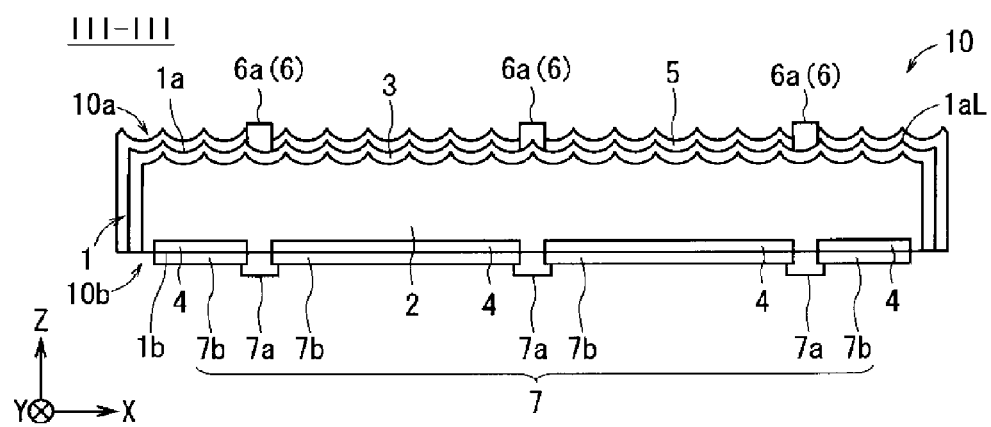
FIG. 3 is a cross-sectional view of an XZ cross-section at the position shown by the single-dot-dashed line III-III in FIG. 1.

FIG. 1 to FIG. 3 show a solar cell element 10 according to an embodiment. As shown in FIG. 1 to FIG. 3, the solar cell element 10 includes a first main surface 10a and a second main surface 10b. The first main surface 10a (also called a light-receiving surface) is a surface that receives incident light. The second main surface 10b (also called a non-light receiving surface) is a surface of the solar cell element 10 that is located at an opposite side from the first main surface 10a. In FIG. 3, the first main surface 10a is illustrated as an upper surface of the solar cell element 10 at a +Z side, and the second main surface 10b is illustrated as a lower surface of the solar cell element 10 at a −Z side.

The solar cell element 10 also includes a plate-shaped semiconductor substrate 1. As shown in FIG. 3, the semiconductor substrate 1 includes a first semiconductor layer 2 and a second semiconductor layer 3. In this case, the first semiconductor layer 2 is a semiconductor layer having a first conductivity type. The second semiconductor layer 3 is a semiconductor layer having a second conductivity type that is the opposite conductivity type of the first conductivity type. The second semiconductor layer 3 is disposed on at least the first main surface 10a side of the first semiconductor layer 2. Additionally, the solar cell element 10 includes first electrodes 6 that are disposed on the first main surface 10a side and that are electrically connected to the second semiconductor layer 3.

Specifically, as shown in FIG. 3, the solar cell element 10 is provided with the semiconductor substrate 1, a third semiconductor layer 4, an anti-reflection layer 5, the first electrodes 6, and second electrodes 7. As described above, the semiconductor substrate 1 includes the first semiconductor layer 2 and the second semiconductor layer 3 which is provided on the first main surface 10a side of the first semiconductor layer 2.

A plate-shaped semiconductor exhibiting the first conductivity type may be used as the first semiconductor layer 2. In this case, the first conductivity type may be, for example, p type. Crystalline silicon such as monocrystalline silicon, polycrystalline silicon or the like may be used as the semiconductor of the first semiconductor layer 2. The thickness of the first semiconductor layer 2 may be, for example, 250 μm or less, and further may be 150 μm or less. The shape of the first semiconductor layer 2 is not particularly restricted, and a quadrangle shape when seen in plan view can facilitate fabrication of the first semiconductor layer 2.

Picked up and described below is an example which uses a plate-shaped crystalline silicon substrate (also called a crystalline silicon substrate) exhibiting p-type conductivity, and in which a first semiconductor layer 2 exhibiting p-type conductivity is formed. In this case, by using at least one of, for example, boron and gallium as the dopant element(s), the first semiconductor layer 2 may be made to exhibit p-type conductivity.

The second semiconductor layer 3 exhibits a second conductivity type that is the opposite of that of the first semiconductor layer 2. The second semiconductor layer 3 is disposed on at least the first main surface 10a side of the first semiconductor layer 2. By doing this, the first semiconductor layer 2 and the second semiconductor layer 3 form a pn junction region. In this case, if the first semiconductor layer 2 exhibits p-type conductivity, the second semiconductor layer 3 may be formed to exhibit n-type conductivity. In this case, for example, by diffusing an impurity element such as phosphorus and/or the like into a region on the first main surface 10a side of a crystalline silicon substrate exhibiting p-type conductivity, the second semiconductor layer 3 is formed within the surface layer of the crystalline silicon substrate. When this is done, a part of the crystalline silicon substrate other than the second semiconductor layer 3 may be the first semiconductor layer 2. If the first semiconductor layer 2 exhibits n-type conductivity, the second semiconductor layer 3 may be formed to exhibit p-type conductivity.

As shown in FIG. 3, an uneven part 1aL is disposed on the first main surface 1a side of the semiconductor substrate 1. In this case, the height of the protruding parts of the uneven part 1aL may be made, for example, 0.1 μm or greater and 10 μm or less, and the width of the protruding parts may be made approximately 1 μm or greater and 20 μm or less. The surface shape of the depressed parts of the uneven part 1aL may be, for example, substantially spherical surfaces.

The height of the protruding parts as noted herein means the distance in the normal line direction to the uppermost surface of a protruding part from a surface which is taken to be the surface (also called a reference surface) passing through the bottom surface of a depressed part and parallel with the second main surface 10b. The width of the protruding parts as noted herein means the distance, in the direction parallel to the above-noted reference surface, between uppermost surfaces of neighboring protruding parts.

The anti-reflection layer 5 is a film for improving the efficiency of absorption of light into the solar cell element 10. The anti-reflection layer 5 is disposed on the first main surface 1a side of the semiconductor substrate 1. Silicon nitride, titanium oxide, silicon oxide, magnesium oxide, indium tin oxide, tin oxide, zinc oxide, or the like, for example, may be used as the material of the anti-reflection layer 5. The thickness of the anti-reflection layer 5 may be set as appropriate to the materials of the semiconductor substrate 1 and the anti-reflection layer 5. Doing this can achieve conditions in the solar cell element 10 under which it is difficult to reflect the light with respect to various irradiation of light. If the semiconductor substrate 1 is a crystalline silicon substrate, the refractive index of the anti-reflection layer 5 may be approximately, for example, 1.8 or greater and 2.3 or less, and the thickness of the anti-reflection layer 5 may be approximately, for example, 50 nm or greater and 120 nm or less. If silicon nitride is used as the anti-reflection layer 5, the anti-reflection layer 5 functions as a passivation film, so that a passivation effect is achieved.

The third semiconductor layer 4 is formed on the second main surface 1b side of the semiconductor substrate 1. The third semiconductor layer 4 exhibits the same conductivity type as the first semiconductor layer 2. The dopant element concentration in the third semiconductor layer 4 is higher than the concentration of the dopant element in the first semiconductor layer 2. That is, the third semiconductor layer 4 is formed by doping of the dopant element into the first semiconductor substrate 1 with a concentration that is higher than the dopant element doped into the semiconductor substrate 1 to form the first semiconductor layer 2. The third semiconductor layer 4 has the role of reducing carrier recombination in the region on the second main surface 1b side of the semiconductor substrate 1. As a result, the existence of the third semiconductor layer 4 reduces the decrease in the conversion efficiency in the solar cell element 10. The third semiconductor layer 4 causes an internal electrical field on the second main surface 1b side of the semiconductor substrate 1. If the first semiconductor layer 2 exhibits p-type conductivity, the third semiconductor layer 4 is formed by diffusing a dopant element of boron, aluminum, or the like, on the second main surface 1b side of the semiconductor substrate 1. When this is done, the concentration of the dopant element in the third semiconductor layer 4 may be approximately, for example, $1 \times 10^{18}$ atoms/cm$^3$ or greater and $5 \times 10^{21}$ atoms/cm$^3$ or less.

The first electrodes 6 are disposed on the first main surface 1a side of the semiconductor substrate 1. As shown in FIG. 1, for example, the first electrodes 6 include: a plurality of first output lead-out electrodes 6a extending in the Y direction; and a large number of linear first collector electrodes 6b extending in the X direction. In this case, at least a part of the first output lead-out electrodes 6a intersects with the first collector electrodes 6b, so as to electrically connect to the first collector electrodes 6b. The width of the first collector electrodes 6b in the short direction may be approximately, for example, 50 μm or greater and 200 μm or less. The width of the first output lead-out electrodes 6a in the short direction may be approximately, for example, 1.3 mm or greater and 2.5 mm or less. That is, the width of the first collector electrodes 6b in the short direction may be smaller than the width of the first output lead-out electrodes 6a in the short direction. Of the plurality of the first collector electrodes 6b, the spacing between neighboring first collector electrodes 6b may be approximately 1.5 mm or greater and 3 mm or less. Additionally, the thickness of the first electrodes 6 may be approximately, for example, 10 μm or greater and 40 μm or less. The first electrodes 6 are formed, for example, by screen printing or the like of an electrically conductive paste (also called a silver paste) containing silver as a main component and to apply with a prescribed pattern onto the first main surface 1a side of the semiconductor substrate 1, followed by firing.

The second electrodes 7 are disposed on the second main surface 1b side of the semiconductor substrate 1. As shown in FIG. 2, the second electrodes 7 include second output lead-out electrodes 7a and second collector electrodes 7b. The thickness of the second output lead-out electrodes 7a may be, for example, approximately 10 μm or greater and 30 μm or less. The width of the second output lead-out electrodes 7a in the short direction may be, for example, approximately 1.3 mm or greater and 7 mm or less. The second output lead-out electrodes 7a are formed using the same material and method of fabrication as the above-noted first electrodes 6. That is, the second output lead-out electrodes 7a are formed, for example, by screen printing or the like of, for example, silver paste to apply with a prescribed pattern onto the second main surface 1b side of the semiconductor substrate 1, followed by firing. Of the main surface on the second main surface 1b side of the semiconductor substrate 1, the second collector electrodes 7b may be formed over the entire surface, with the exception of the region in which the second output lead-out electrodes 7a are formed. The thickness of the second collector electrodes 7b may be approximately 15 μm or greater and 50 μm or less. The second collector electrodes 7b are formed, for example, by screen printing or the like of an electrically conductive paste (also called an aluminum paste) containing aluminum as a main component to apply with a prescribed pattern onto the second main surface 1b side of the semiconductor substrate 1, followed by firing.

(2) SOLAR CELL MODULE

A solar cell module 20 according to an embodiment includes at least one solar cell element 10. For example, the solar cell module 20 may include a plurality of electrically connected solar cell elements 10. A solar cell module 20 such as this is formed by the series or parallel connection of a plurality of solar cell elements 10 if the electrical output of a single solar cell element 10 is small. Also, a plurality of solar cell modules 20 are combined to extract a practically usable electrical output. In the following, a solar cell module 20 including a plurality of solar cell elements 10 is described as an example.

Figure 4:
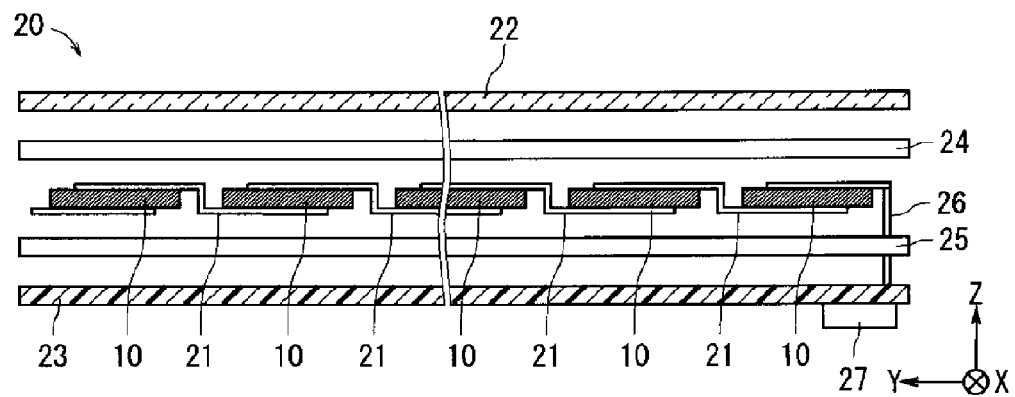
FIG. 4 is an exploded view schematically showing a cross-section of a solar cell module according to an embodiment.

As shown in FIG. 4, the solar cell module 20 includes, for example, a laminate body that is the lamination of a transparent member 22, a front-side filling material 24, a plurality of solar cell elements 10, interconnect members 21, a rear-side filling material 25, and a rear-surface protective material 23. In this case, the transparent member 22 is a member for protecting the light-receiving surfaces of the solar cell modules 20, which receive sunlight. The transparent member 22 is, for example, a transparent flat sheet-shaped member. Glass or the like, for example, may be used as the material of the transparent member 22. A transparent filling material, for example, may be used as the material of the front-side filling material 24 and the rear-side filling material 25. An ethylene-vinyl acetate (EVA) polymer or the like may be used, for example, as the material of the front-side filling material 24 and the rear-side filling material 25. The rear-surface protective material 23 is a member for protecting the solar cell module 20 from the rear surface. Polyethylene terephthalate (PET) or a polyfluoride (PVF) resin, for example, may be used as the material of the rear-surface protective material 23. The rear-surface protective material 23 may include either a single-layer structure or a laminated structure.

The interconnect members 21 (also called connection members) are members that electrically connect a plurality of solar cell elements 10. Of the plurality of solar cell elements 10 included in the solar cell module 20, solar cell elements 10 that are neighboring in the Y direction include the first electrodes 6 of one solar cell element 10 connected to the second electrodes 7 of another solar cell element 10 by interconnect members 21. By doing this, a plurality of solar cell elements 10 are electrically connected in series. In this case, the thickness of the interconnect members 21 may be approximately, for example, 0.1 mm or greater and 0.2 mm or less. The width of the interconnect members 21 may be approximately 2 mm. Members, for example, including a copper foil, the entire surface of which is covered by solder, or the like, can be used as the interconnect members 21.

Figure 5:
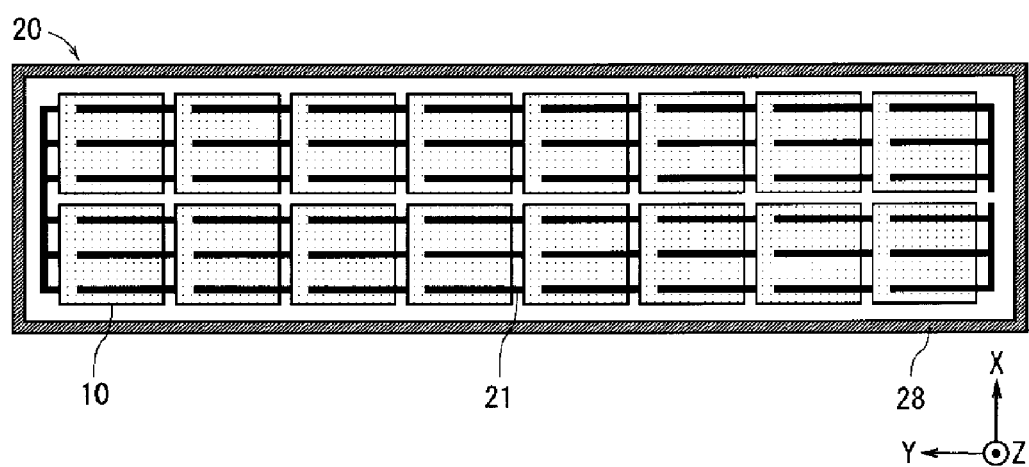
FIG. 5 is a plan view schematically showing an outer appearance of a solar cell module according to an embodiment.

Of the plurality of solar cell elements 10 electrically connected in series, one end of the electrode of the first solar cell element 10 and one end of the electrode of the last solar cell element 10 are each electrically connected by an output lead-out interconnect 26 to a terminal box 27 serving as an output lead-out unit. Although it is not illustrated in FIG. 4, the solar cell module 20 may, as shown in FIG. 5, include a frame 28 that holds the above-noted laminate body from its periphery. Aluminum or the like, which has both corrosion resistance and strength, for example, may be used as the material of the frame 28.

In the solar cell elements 10 included in the solar cell module 20 according to this embodiment, the above-noted uneven part 1aL exists to reduce the reflection of light at the light-receiving surface, enabling the capture of light to within the solar cell elements 10 with good efficiency. In addition, in solar cell elements 10, the reduction of metal elements mixing in with the semiconductor substrate 1, which will be described later, facilitates the achievement of good output characteristics. It is therefore possible to achieve a solar cell module 20 having good output characteristics.

<(3) SOLAR CELL ELEMENT MANUFACTURING METHOD

<(3-1) Overview of the Solar Cell Element Manufacturing Method>

Figure 6:
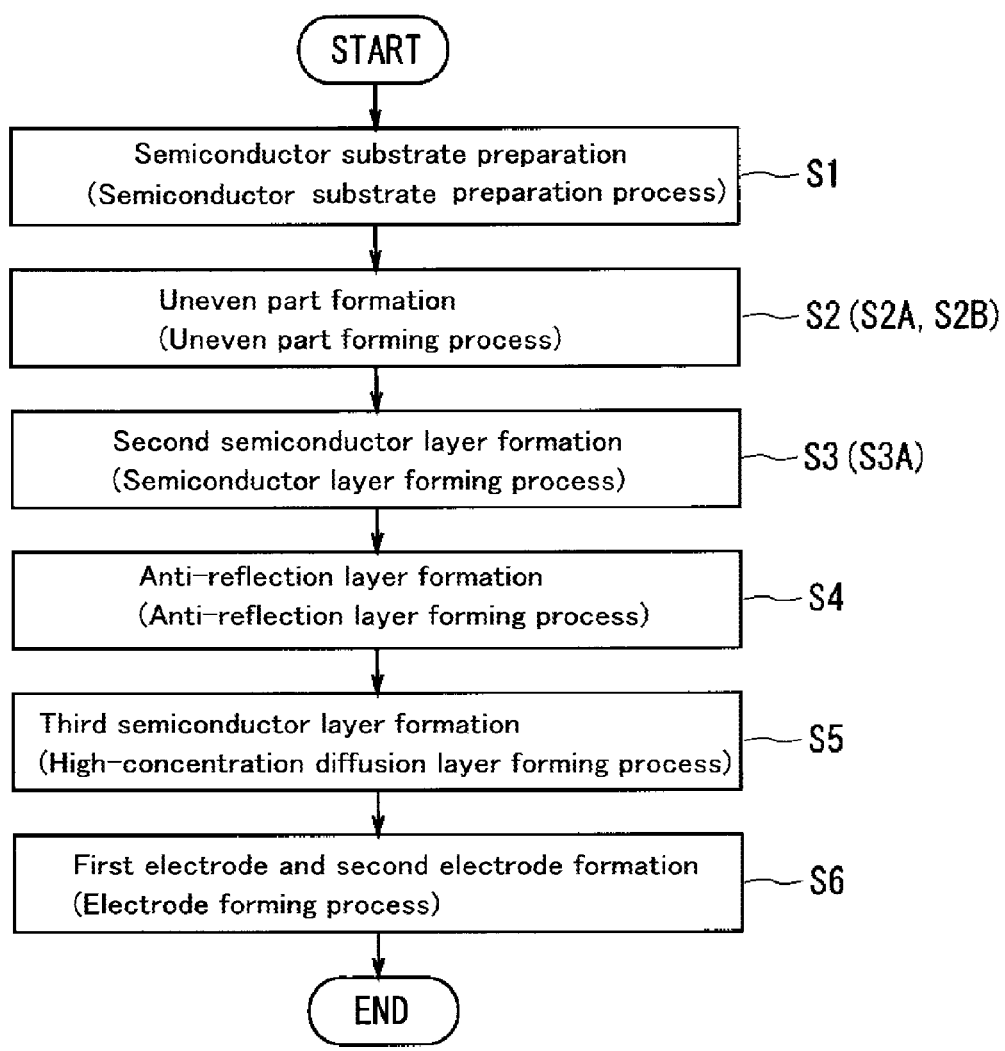
FIG. 6 is a flowchart showing a manufacturing flow for a solar cell element according to an embodiment.

FIG. 6 is a flowchart showing the manufacturing flow for a solar cell element 10 according to an embodiment. In this case, as shown in FIG. 6, sequentially performing steps S1 to S6 manufactures a solar cell element 10.

First, step S1 performs a process (also called a substrate preparation process) of preparing the semiconductor substrate 1 exhibiting a first conductivity type. The first conductivity type may be, for example, p type. Step S2 performs a process (also called an uneven part forming process) of forming an uneven part 1aL on the first main surface 1a by subjecting the first main surface 1a of the semiconductor substrate 1 to etching treatment using an acid aqueous solution. Step S3 performs a process (also called a semiconductor layer forming process) of forming, in a region on the first main surface 1a side of the semiconductor substrate 1, a second semiconductor layer 3 having a second conductivity type that is the opposite of the first conductivity type. In this case, of the semiconductor substrate 1, a part other than the second semiconductor layer 3 may be the first semiconductor layer 2. Due to this, formed is a semiconductor substrate 1 including: a first semiconductor layer 2 exhibiting a p-type conductivity; and a second semiconductor layer 3 exhibiting an n-type conductivity, and also including an uneven part 1aL.

Next, step S4 performs a process (also called an anti-reflection layer forming process) of forming the anti-reflection layer 5 on the first main surface 1a of the semiconductor substrate 1, that is, on the second semiconductor layer 3. Step S5 performs a process (also called a high-concentration diffusion layer forming process) of forming the third semiconductor layer 4 by diffusing one or more dopant elements for the first conductivity type into a region on the second main surface 1b side of the semiconductor substrate 1 with a high concentration. Step S6 performs a process (also called an electrode forming process) of forming the first electrodes 6 on the second semiconductor layer 3, of the semiconductor substrate 1, having a second conductivity type and also of forming the second electrodes 7 on the second main surface 1b, which is opposite side of the first main surface 1a, of the semiconductor substrate 1.

Each of the above-noted processes in the manufacturing flow for the solar cell element 10 is described in detail below.

<(3-2) Substrate Preparation Process>

When the semiconductor substrate 1 is a monocrystalline silicon substrate, the semiconductor substrate 1 is formed, for example, by the pulling method or the like. When the semiconductor substrate 1 is a polycrystalline silicon substrate, the semiconductor substrate 1 is formed, for example, by the casting method or the like. In the following, an example of using a p-type polycrystalline silicon substrate as the semiconductor substrate 1 is described.

Figure 7:
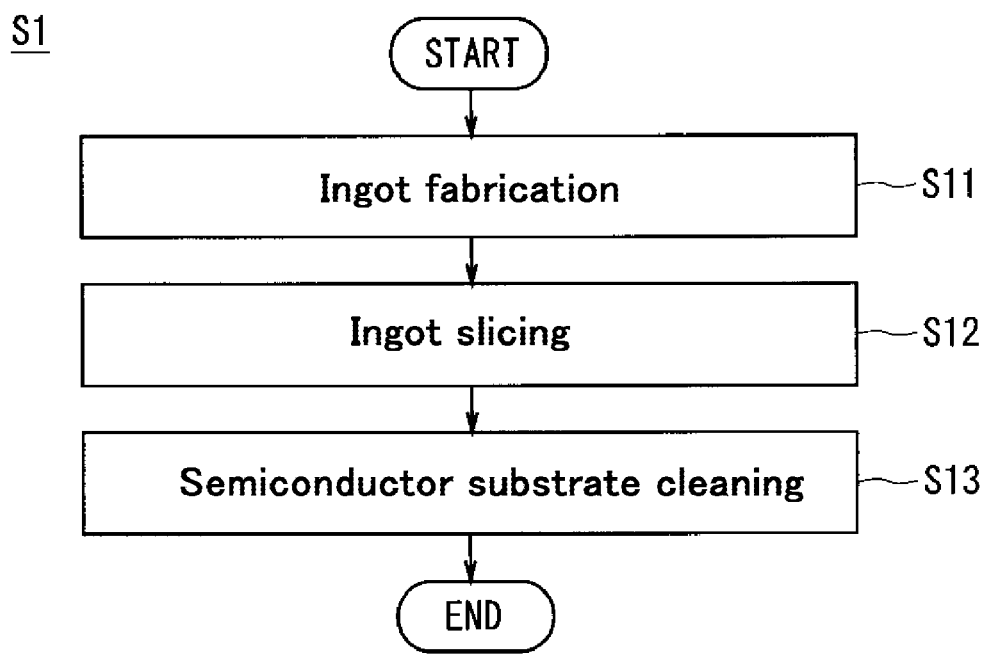
FIG. 7 is a flowchart showing a processing flow of an embodiment of a substrate preparation process.

FIG. 7 is a flowchart of the processing flow of the substrate preparation process according to an embodiment. The substrate preparation process, as shown in FIG. 7, sequentially performs the processing of steps S11 to S13 to prepare the semiconductor substrate 1.

First, step S11 fabricates a polycrystalline silicon ingot as the semiconductor material by casting. Step S12 thinly slices the ingot fabricated at step S11, for example, to a thickness of 250 μm or less. In this case, a fixed abrasive type of wire saw apparatus, in which an abrasive has been fixed to a wire (also called an abrasive-bearing wire) beforehand is used to thinly slice the ingot. With this, the semiconductor substrate 1 is formed. Step S13 cleans the semiconductor substrate 1 that has been contaminated at step S12 by washing using a washing fluid. With this, the semiconductor substrate 1 is prepared.

In this case, the semiconductor substrate 1 that has been prepared in the above-noted substrate preparation process includes a layer with mechanical damage (also called a mechanically damaged layer) in the cutting plane at which it was thinly sliced and in the vicinity thereof. Under observation by an electron microscope, in the cutting plane of a semiconductor substrate formed using a fixed abrasive type of wire saw apparatus, compared to the cutting plane of a semiconductor substrate formed using a free abrasive type of wire saw apparatus, there are fewer microcracks, and the depth thereof is small, being approximately 1 µm or less. The electron microscope may be, for example, a scanning electron microscope (SEM). According to the evaluation results for residual stress at the cutting plane using micro-Raman spectroscopy, there is a compressive stress of approximately 200 MPa or greater and 500 MPa or less at the cutting plane of the semiconductor substrate 1 formed using a fixed abrasive type of wire saw apparatus. In contrast, the compressive stress at the cutting plane of a semiconductor substrate formed by a free abrasive type of wire saw apparatus is 200 MPa or less. That is, by using a fixed abrasive type of wire saw apparatus, it is thought that a semiconductor substrate 1 is obtained that has little mechanical damage and little release of residual stress caused by the occurrence of microcracks and the like.

In the process of cleaning the semiconductor substrate 1 in step S13, a very small amount of etching treatment may be done to the surface of the semiconductor substrate 1, using an aqueous solution of NaOH, KOH, hydrofluoric acid, fluoronitric acid, or the like. This removes a contaminated layer (also called a contamination layer) and the mechanically damaged layer of the semiconductor substrate 1.

<(3-3) Uneven Part Forming Process>

Wet etching treatment using an alkaline aqueous solution such as NaOH and an acid aqueous solution such as fluoronitric acid, or dry etching treatment using RIE (reactive ion etching) or the like is used as the method for forming the uneven part 1aL. In the following, first to third embodiments of the uneven part forming process are described as examples.

<(3-3-1) First Embodiment of the Uneven Part Forming Process>

The first embodiment of the uneven part forming process performs processing by wet etching treatment using an acid aqueous solution and treatment using an alkaline aqueous solution. Specifically, the first embodiment of the uneven part forming process sequentially performs a first processing step of subjecting the first main surface 1a of the semiconductor substrate 1 to etching treatment, a second processing step of subjecting the first main surface 1a to treatment using an alkaline aqueous solution, and a third processing step of subjecting the first main surface 1a to etching treatment. In this case, the first b processing step subjects the first main surface 1a to etching treatment using an acid aqueous solution containing hydrofluoric acid and nitric acid. This forms an uneven part 1aL on the first main surface 1a. The third processing step subjects the first main surface 1a to at least one of etching treatment by an acid aqueous solution containing hydrofluoric acid and hydrochloric acid (also called a mixed acid aqueous solution) and etching treatment by a hydrofluoric acid aqueous solution and a hydrochloric acid aqueous solution.

A process of washing the semiconductor substrate 1 with water (also called a water washing process) may performed after the first processing step and before the second processing step. A water washing process may be performed on the semiconductor substrate 1 after the second processing step and before the third processing step. The water washing process, however, need not be performed.

Figure 8:
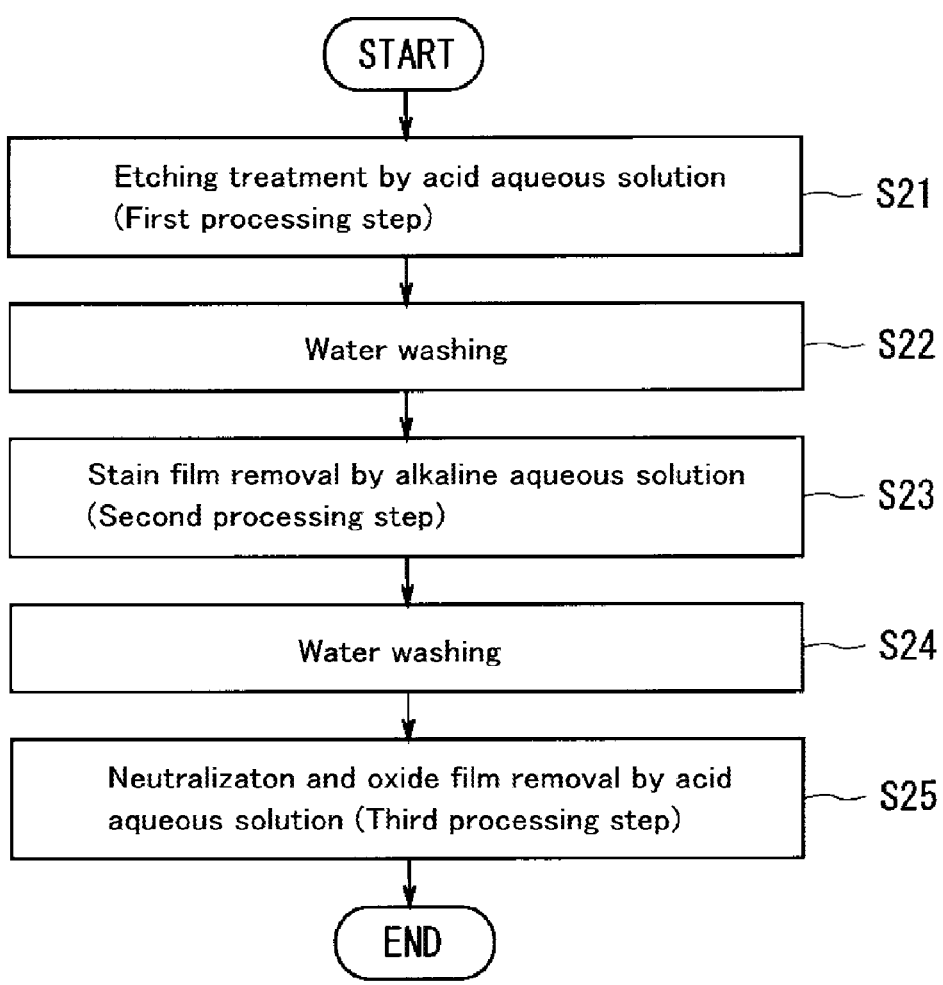
FIG. 8 is a flowchart showing a processing flow of a first embodiment of an uneven part forming process.

FIG. 8 is a flowchart showing an example of the processing flow of the first embodiment of the uneven part forming process. As shown in FIG. 8, the first embodiment of the uneven part forming process sequentially performs steps S21 to S25, thereby forming the uneven part 1aL on the first main surface 1a of the semiconductor substrate 1.

Step S21 performs, for example, the first processing step. This first processing step, for example, immerses the semiconductor substrate 1 into an acid aqueous solution containing hydrofluoric acid and nitric acid. This forms the uneven part 1aL on the first main surface 1a of the semiconductor substrate 1.

Step S22 performs a water washing process, in which the semiconductor substrate 1 is washed by water. In this water washing process, for example, a cassette holding one or more semiconductor substrates 1 may be immersed in water placed in a water washing tank. In this case, the duration of the immersion of the cassette in the water may be approximately, for example, 5 seconds or longer and within 60 seconds. The water temperature may be approximately, for example, 15° C. or higher and 40° C. or less. Instead of immersing the semiconductor substrate 1 in water, the semiconductor substrate 1 may be water washed by using a shower apparatus or the like to pour water thereover. This reduces the mixture of the acid aqueous solution into the next process after the water washing process.

Step S23 performs the second processing step. This removes a stain film formed on the surface of the semiconductor substrate 1. This second processing step may immerse the semiconductor substrate 1 in an alkaline aqueous solution. In this case, an aqueous solution containing at least one type of sodium hydroxide, potassium hydroxide, ammonium hydroxide, and sodium bicarbonate is used as the alkaline aqueous solution. More specifically, for example, a cassette holding at least one semiconductor substrate 1 may be immersed in an ammonium hydroxide aqueous solution that has been placed in a processing tank. In this case, the mass concentration of the ammonium hydroxide in the ammonium hydroxide aqueous solution may be, for example, 0.005% or greater and 5% or less. The immersion time of the cassette in the ammonium hydroxide aqueous solution may be approximately, for example, 5 seconds or longer and within 200 seconds. The temperature of the ammonium hydroxide aqueous solution may be approximately, for example, 10° C. or higher and 40° C. or lower.

Step S24 performs a water washing process, in which the semiconductor substrate 1 is washed by water. This water washing process may be performed by the same processing as in the water washing process at step S22. Doing this reduces the mixture of the alkaline aqueous solution of the water washing process into the next process.

Step S25 performs the third processing step. The third processing step immerses the semiconductor substrate 1 into a mixed acid aqueous solution containing, for example, hydrofluoric acid and hydrochloric acid. In this step, alkaline aqueous solution adhered to the semiconductor substrate 1 is neutralized by the mixed acid aqueous solution, and oxide film formed on the surface of the semiconductor substrate 1 is removed. Also, for example, sodium ions and potassium ions that have become adhered to the region of the surface of the semiconductor substrate 1 in the second processing step at step S23 are removed by the hydrochloric acid. This can reduce the possibility of diffusion of a metal impurity into the semiconductor substrate 1 in a subsequent semiconductor layer forming process (step S3 in FIG. 6), or the like. As a result, the decrease in the conversion efficiency of the solar cell element 10 is reduced. That is, a solar cell element 10 having good output characteristics is achieved. Also, a water washing process and a drying process may be adopted in the next process.

The third processing step may sequentially perform the immersion of the semiconductor substrate 1 into a hydrofluoric acid aqueous solution and the immersion of the semiconductor substrate 1 into a hydrochloric acid aqueous solution. Also, the third processing step may perform treatment by steam containing hydrofluoric acid and hydrochloric acid. Steam containing hydrofluoric acid and hydrochloric acid is generated, for example, by heating a mixed acid aqueous solution containing hydrofluoric acid and hydrochloric acid. Steam containing hydrofluoric acid and hydrochloric acid may be generated by another method, for example, by blowing into and passing a carrier gas through a mixed acid aqueous solution containing hydrofluoric acid and hydrochloric acid. The third processing step may sequentially perform treatment by steam containing hydrofluoric acid and treatment by steam containing hydrochloric acid. That is, it is sufficient that the third processing step subject the first main surface 1a to etching treatment by hydrofluoric acid and hydrochloric acid.

The first embodiment of the uneven part forming process may form an uneven part on the second main surface 1b side of the semiconductor substrate 1 as well.

<(3-3-2) Second Embodiment of the Uneven Part Forming Process>

The second embodiment of the uneven part forming process performs processing by dry etching using RIE or the like. Specifically, the second embodiment of the uneven part forming process sequentially performs a process (also called the etching using residue process) that etches by causing etching residue to become adhered to the first main surface 1a of the semiconductor substrate 1 and a process (also called the residue removal process) of removing the etching residue from the first main surface 1a. In this case, the residue removal process subjects the first main surface 1a to etching treatment using hydrofluoric acid and hydrochloric acid. This removes the etching residue from the first main surface 1a.

Figure 9:
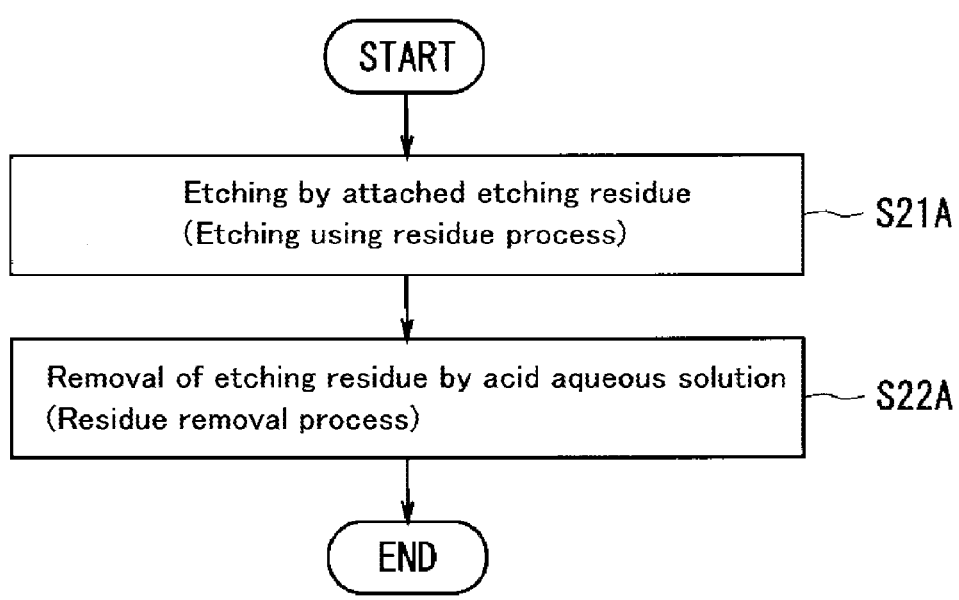
FIG. 9 is a flowchart showing a processing flow of a second embodiment of an uneven part forming process.

FIG. 9 is a flowchart showing an example of the processing flow in the second embodiment of the uneven part forming process. In this case, in place of the step S2 that performs the processes of the above-noted steps S21 to S25 shown in FIG. 8, a step S2A that sequentially performs the processing of steps S21A to S22A as shown in FIG. 9 is performed. This can form the uneven part 1aL on the first main surface 1a of the semiconductor substrate 1.

Step S21A performs an etching using residue process. In the etching using residue process, for example, a chlorine-based gas, a fluorine-based gas, and an oxygen gas are used as an etching gas, which is made into a plasma to subject the first main surface 1a to etching treatment. In this etching treatment, although corrosive action causes constituent components to leave from the first main surface 1a of the semiconductor substrate 1, the leaving from the first main surface 1a of a part of the constituent components is incomplete, and they remain adhered to the first main surface 1a of the semiconductor substrate 1. Also, a part of the constituent components that have once left the first main surface 1a might become adsorbed to the first main surface 1a. As a result, constituent components that remain on or become adsorbed to the first main surface 1a constitute an etching residue. That is, in this etching process, an etching residue having as a main component the material of the semiconductor substrate 1 is intentionally caused to remain on or become adhered to the first main surface 1a of the semiconductor substrate 1 and is used as a mask. The use of this etching residue as a mask in etching treatment roughens the first main surface 1a of the semiconductor substrate 1.

Step S22A performs a residue removal process. The residue removal process, for example, treats the first main surface 1a of the semiconductor substrate 1 by a mixed acid aqueous solution containing hydrofluoric acid and hydrochloric acid, so as to remove the etching residue from the first main surface 1a. In this case, for example, a dilute hydrofluoric acid aqueous solution containing hydrochloric acid with a mass concentration of 2% or greater and 20% or less is used as the mixed acid aqueous solution containing hydrofluoric acid and hydrochloric acid. A cassette holding one or more semiconductor substrates 1 may be immersed in a dilute hydrofluoric acid aqueous solution containing hydrochloric acid that has been placed in a processing tank. In this case, the mass concentration of the hydrochloric acid in the dilute hydrofluoric acid aqueous solution containing hydrochloric acid may be an arbitrarily pre-established mass concentration. The immersion time of the cassette in the dilute hydrofluoric acid aqueous solution containing hydrochloric acid may be approximately, for example, 5 seconds or longer and within 120 seconds. The temperature of the dilute hydrofluoric acid aqueous solution containing hydrochloric acid may be approximately, for example, 10° C. or higher and 60° C. or lower. A water washing process and a drying process may be adopted in the next process.

The residue removal process may sequentially immerse the semiconductor substrate 1 into a hydrofluoric acid aqueous solution and immerse the semiconductor substrate 1 into a hydrochloric acid aqueous solution. The residue removal process may perform treatment by steam containing hydrofluoric acid and hydrochloric acid. Steam containing hydrofluoric acid and hydrochloric acid may be generated, for example, by heating a mixed acid aqueous solution containing hydrofluoric acid and hydrochloric acid. Steam containing hydrofluoric acid and hydrochloric acid may be generated by another method, such as blowing into and passing a carrier gas through a mixed acid aqueous solution containing hydrofluoric acid and hydrochloric acid. The residue removal process may sequentially perform treatment by steam containing hydrofluoric acid and treatment by steam containing hydrochloric acid. That is, it is sufficient that the residue removal process subject the first main surface 1a to etching treatment by hydrofluoric acid and hydrochloric acid.

In general, an uneven part 1aL formed by RIE has finer unevenness than an uneven part 1aL formed by wet etching treatment. For this reason, the water repellency in the part of the first main surface 1a in which the uneven part 1aL is formed tends to worsen. In contrast, a natural oxide film formed on the first main surface 1a by contact with air after the etching using residue process of step S21A is effectively removed by treatment with a mixed acid aqueous solution containing, for example, hydrochloric acid. Doing this improves the water repellency of the first main surface 1a of the semiconductor substrate 1. This facilitates drying of the first main surface 1a after the treatment by the fluid and reduces the occurrence of water marks on the first main surface 1a.

<(3-3-3) Third Embodiment of the Uneven Part Forming Process>

The third embodiment of the uneven part forming process performs wet etching treatment using an acid aqueous solution. Specifically, the third embodiment of the uneven part forming process sequentially performs a first etching process that subjects the first main surface 1a of the semiconductor substrate 1 to a first etching treatment and a second etching process that subjects the first main surface 1a to a second etching treatment. This forms the uneven part 1aL on the first main surface 1a. In this case, the first etching process subjects the first main surface 1a to the first etching treatment by an acid aqueous solution (also called the first acid aqueous solution) containing hydrofluoric acid, nitric acid, and sulfuric acid. The second etching process subjects the first main surface 1a to the second etching treatment by an acid aqueous solution (also called the second acid aqueous solution) containing hydrofluoric acid and nitric acid, but substantially not containing sulfuric acid. In this case, the expression "substantially not containing sulfuric acid" means that the inclusion of a very small amount of sulfuric acid can be permitted.

The third embodiment of the uneven part forming process may perform a first water washing process of washing the semiconductor substrate 1 with water after the first etching process step and before the second etching process step. A second water washing process of washing the semiconductor substrate 1 with water may be performed after the second etching process step. Either one of or neither of the first and second water washing processes may be performed. Additionally, when a stain film is formed on the surface of the semiconductor substrate 1 after the second water washing process, the semiconductor substrate 1 may be immersed in an alkaline aqueous solution to remove the stain film, in which case a third water washing process of washing the semiconductor substrate 1 may be performed after the treatment by the alkaline aqueous solution.

Figure 10:
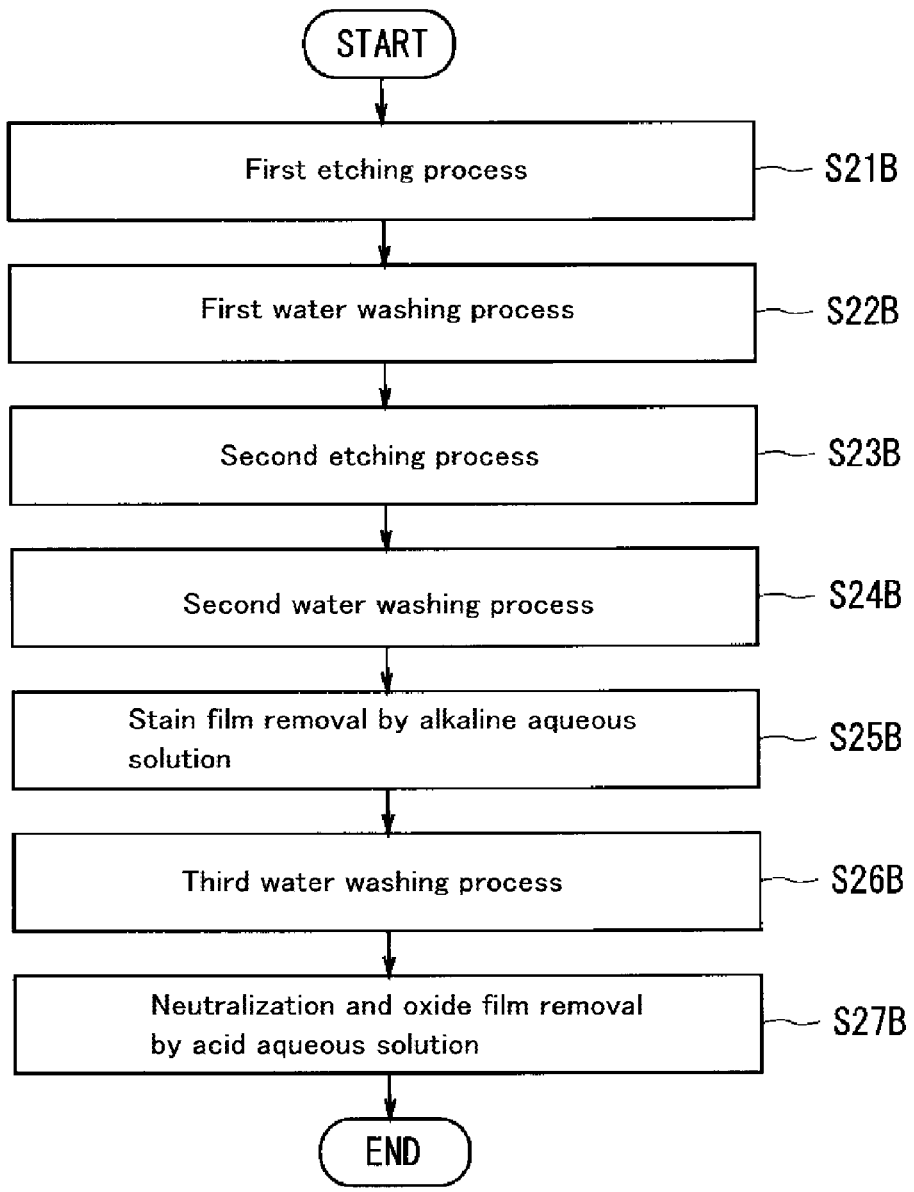
FIG. 10 is a flowchart showing a processing flow of a third embodiment of an uneven part forming process.
Figure 11:
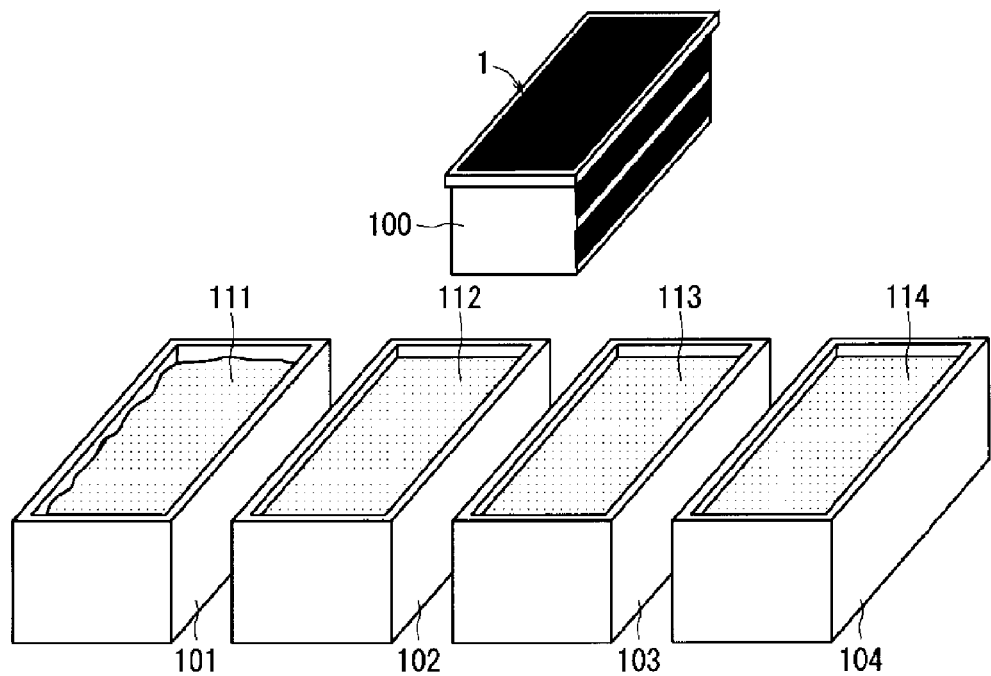
FIG. 11 is a perspective view for explaining the third embodiment of the uneven part forming process.

FIG. 10 is a flowchart showing an example of the processing flow in the third embodiment of the uneven part forming process. FIG. 11 is a drawing for explaining the third embodiment of the uneven part forming process. In this case, as shown in FIG. 10, in place of step S2 that performs the above-noted steps S21 to S25 shown in FIG. 8, a step S2B that sequentially performs steps S21B to S27B is performed. Doing this forms the uneven part 1aL on the first main surface 1a of the semiconductor substrate 1. In this case, for example, by using a fixed abrasive type of wire saw apparatus, a semiconductor substrate 1 is obtained that has little mechanical damage and little release of residual stress caused by the occurrence of microcracks and the like.

Step S21B subjects the first main surface 1a of the semiconductor substrate 1 to the first etching treatment by a first acid aqueous solution 111. Specifically, for example, as shown in FIG. 11, a cassette 100 holding several tens of to approximately a hundred semiconductor substrates 1 is immersed in the first acid aqueous solution 111 that has been placed in a first processing tank 101. When this is done, for example, the semiconductor substrates 1 may be immersed in the first acid aqueous solution 111 so that the first main surface 1a of the semiconductor substrates 1 and the fluid surface of the first acid aqueous solution 111 are substantially perpendicular. The method of immersing the semiconductor substrate 1 into the first acid aqueous solution 111 is not restricted to the method of immersing the above-described cassette 100 into the first acid aqueous solution 111 and, for example, can be selected as appropriate to the etching apparatus and the shape and the like of the semiconductor substrates 1.

The first acid aqueous solution 111, for example, may be a mixture of a hydrofluoric acid aqueous solution with a mass concentration of 46% of hydrofluoric acid, a nitric acid aqueous solution with a mass concentration of 60% of nitric acid, and a sulfuric acid aqueous solution with a mass concentration of 95% sulfuric acid. The volume ratio of the hydrofluoric acid aqueous solution with a mass concentration of 46% of hydrofluoric acid, the nitric acid aqueous solution with a mass concentration of 60% of nitric acid, and the sulfuric acid aqueous solution with a mass concentration of 95% sulfuric acid that are mixed may be, for example, 1:1 to 4:5 to 20. In the first etching process, the temperature of the first acid aqueous solution 111 may be approximately, for example, 15° C. or higher and 40° C. or lower. The duration of immersion of the semiconductor substrates 1 in the first acid aqueous solution 111 may be approximately, for example, 10 seconds or longer and within 180 seconds. The first acid aqueous solution 111 may contain an acid that is different from hydrofluoric acid, nitric acid, and sulfuric acid. For example, acetic acid may be added to the first acid aqueous solution 111 to control the etching rate in the first etching treatment.

Using the first acid aqueous solution 111 in the first etching treatment forms a silicon oxide by the oxidation of the surface of the silicon substrate as the semiconductor substrate 1 by the nitric acid. When this occurs, bubbles of nitrous oxide based gas and nitrous oxide-hydrogen gas are generated. The silicon oxide that is generated is etched by the hydrofluoric acid. In this case, the chemical equation of the main reaction in the first etching treatment is as following.

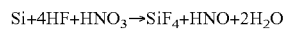

$$Si+4HF+HNO_3 \rightarrow SiF_4+HNO+2H_2O$$

By the HNO present in the substance generated by the reaction (also called the reaction product) further reacting with water, bubbles of $HNO_2$ gas are generated. When this occurs, the viscosity of the first acid aqueous solution 111 increases because of the inclusion of sulfuric acid. This results in a tendency for bubbles to remain in contact with the first main surface 1a of the semiconductor substrate 1. As a result, compared with the region of the first main surface 1a of the semiconductor substrate 1 not in contact with bubbles, the etching rate of the region of the semiconductor substrate 1 in contact with bubbles is slow, thereby preferably forming a first main surface 1a including an uneven part.

When the method is used whereby the above-noted cassette 100 is immersed in the first acid aqueous solution 111, $HNO_2$ gas bubbles tend to be held locally between neighboring semiconductor substrates 1 in the cassette 100. For example, when the spacing between neighboring semiconductor substrates 1 is 3 mm or greater and 5 mm or less, bubbles tend to be maintained between neighboring semiconductor substrates 1. As a result, of the surface of the semiconductor substrate 1, compared with the region not in contact with bubbles, the region in contact with bubbles has a slower etching rate of the semiconductor substrate 1. As a result, there is a further preferable forming of an uneven part on the first main surface 1a of the semiconductor substrate 1.

If there exists a damaged layer on the surface of the semiconductor substrate 1, etching treatment progresses preferentially in a region of the surface of the semiconductor substrate 1 having crystal faults in the damaged layer. As a result, on the surface of the semiconductor substrate 1, depressions can form with the damaged layer as an origin, and etching can proceed therefrom. As a result, the shapes of the depressions formed in the surface of the semiconductor substrate 1 become large, and the uneven part is preferably formed.

The uneven part formed on the first main surface 1a by the first etching process, compared with the uneven part 1aL ultimately formed in the semiconductor substrate 1, includes many protruding parts that are flat regions. That is, in the uneven part formed by the first acid aqueous solution 111, compared with the uneven part 1aL ultimately formed on the semiconductor substrate 1, the uppermost surfaces of the protruding parts are wide.

The amount of etching of the semiconductor substrate 1 in the first etching process (also called the etched amount) is calculated, for example, by converting the amount of change of weight of the semiconductor substrate 1 between before and after the etching treatment to a thickness of the semiconductor substrate 1. The etched amount may be approximately, for example, a thickness of 0.1 μm or greater and 20 μm or less at one surface of the semiconductor substrate 1.

Step S22B performs a first water washing process that washes the semiconductor substrate 1 with water. This reduces the mixture of the first acid aqueous solution 111 into the second acid aqueous solution 113 used in the second etching process of step S23B. As a result, the etching rate in the second etching treatment is maintained. In this case, for example, as shown in FIG. 11, a cassette 100 holding several tens of to approximately a hundred semiconductor substrates 1 is immersed into water 112 that has been placed in a first water washing tank 102. In this case, the time of immersion of the cassette into the water 112 may be, for example, approximately 5 seconds or longer and within 60 seconds. The temperature of the water 112 may be, for example, approximately 15° C. or higher and 40° C. or lower. Instead of immersion in the water 112, the semiconductor substrate 1 may be water washed by using a shower apparatus or the like to pour water thereover. This reduces the mixture of the first acid aqueous solution 111 into the processing of the next process after the first water washing process.

Step S23B subjects the first main surface 1a of the semiconductor substrate 1 to a second etching treatment by the second acid aqueous solution 113. Specifically, for example, as shown in FIG. 11, a cassette 100 holding several tens of to approximately a hundred semiconductor substrates 1 is immersed into the second acid aqueous solution 113 that has been placed into a second processing tank 103. Doing this subjects the first main surfaces 1a of the semiconductor substrates 1 that have been etching treated by the first acid aqueous solution 111 to etching treatment by the second acid aqueous solution 113. When this is done, for example, immersion may be done so that the semiconductor substrates 1 are immersed in the second acid aqueous solution 113 so that the first main surfaces 1a of the semiconductor substrates 1 and the fluid surface of the second acid aqueous solution 113 are substantially perpendicular.

The second acid aqueous solution 113, for example, may be a mixture of a hydrofluoric acid aqueous solution with a mass concentration of 46% of hydrofluoric acid, a nitric acid aqueous solution with a mass concentration of 60% of nitric acid, and water. The volume ratio of the hydrofluoric acid aqueous solution with the mass concentration of 46% of hydrofluoric acid, the nitric acid aqueous solution with a mass concentration of 60% of nitric acid, and water that are mixed may be, for example, 2 to 6:12:5 to 20. In the second etching process, the temperature of the second acid aqueous solution 113 may be approximately, for example, 5° C. or higher and 40° C. or lower. The duration of immersion of the semiconductor substrates 1 in the second acid aqueous solution 113 may be approximately, for example, 60 seconds or longer and within 180 seconds. The second acid aqueous solution 113 may contain an acid that is different hydrofluoric acid, nitric acid, and sulfuric acid. For example, acetic acid may be added to the second acid aqueous solution 113 to control the etching rate of the second etching treatment.

By using the second acid aqueous solution 113 in the second etching process, etching treatment progresses on the first main surface 1a, with the uneven part formed by the first acid aqueous solution 111 as the base. Doing this can reduce the flat regions on the protruding parts of the uneven part. As a result, an uneven part 1aL is formed that preferably reduces the reflection of light. In this case, the chemical equation of the main reaction in the second etching process is as follows.

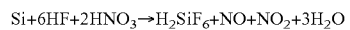

$$Si+6HF+2HNO_3 \rightarrow H_2SiF_6+NO+NO_2+3H_2O$$

The amount of etching of the semiconductor substrate 1 in the second etching process (also called the etched amount) is calculated by converting the amount of change of weight of the semiconductor substrate 1 between before and after the etching treatment to a thickness of the semiconductor substrate 1. The etched amount may be approximately, for example, a thickness of 1 μm or greater and 5 μm or less at one surface of the semiconductor substrate 1. This forms an uneven part 1aL on the first main surface 1a side of the semiconductor substrate 1. In this case, the height of the protruding parts of the uneven part 1aL may be, for example, approximately 0.1 μm or greater and 10 μm or less, and the width of the protruding parts may be, for example, approximately 1 μm or greater and 20 μm or less. The surface shape of the depressed parts of the uneven part 1aL may be, for example, substantially spherical surfaces.

The temperature T2 of the second acid aqueous solution 113 in the second etching process may be lower than the temperature T1 of the first acid aqueous solution 111 in the first etching process. That is, the first main surface 1a of the semiconductor substrate 1 may be subjected to the second etching treatment by the second acid aqueous solution 113 while maintaining the relationship T1>T2. Doing this reduces the reaction of the semiconductor substrate 1 with the second acid aqueous solution 113, and causes preferential etching of a part in which silicon atoms are weakly bonded. As a result, an uneven part 1aL is formed in which the reflection of light is further preferably reduced. In this case, the temperature of the second acid aqueous solution 113 may be set, for example, to 5° C. or higher and 12° C. or lower.

The mass ratio of the nitric acid aqueous solution to the hydrofluoric acid aqueous solution in the second acid aqueous solution 113 in the second etching process may be higher than the mass ratio of the nitric acid aqueous solution to the hydrofluoric acid aqueous solution in the first acid aqueous solution 111. Stated differently, the value of the mass of the nitric acid divided by the mass of the hydrofluoric acid may be larger in the second acid aqueous solution 113 than in the first acid aqueous solution 111. That is, the first main surface 1a of the semiconductor substrate 1 may be subjected to the second etching treatment by the second acid aqueous solution 113 having a mass ratio of R2 of the nitric acid mass with respect to the mass of hydrofluoric acid that is higher than the mass ratio of R1 of the nitric acid mass with respect to the mass of hydrofluoric acid in the first acid aqueous solution 111. The ratio R1 for the first acid aqueous solution 111 may be a value of the mass of the nitric acid divided by the mass of the hydrofluoric acid. The ratio R2 for the second acid aqueous solution 113 may be a value of the mass of the nitric acid divided by the mass of the hydrofluoric acid. Such conditions reduce the etched amount of the semiconductor substrate 1 in the second etching process, resulting in a further reduction of the flat regions in the protruding parts of the uneven part 1aL. The ratio R1 and the ratio R2 may be ratios of, for example, the volume of the nitric acid aqueous solution with respect to the volume of the hydrofluoric acid aqueous solution for the hydrofluoric acid aqueous solution and the nitric acid aqueous solution that are to be mixed. That is, they may be values of the volume of nitric acid aqueous solution divided by the volume of hydrofluoric acid aqueous solution. In this case, for example, a hydrofluoric acid aqueous solution with a mass concentration of 46% of hydrofluoric acid and a nitric acid aqueous solution with a mass concentration of 60% of nitric acid may be used.

Step S24B performs the second water washing process that washes the semiconductor substrate 1 with water. This reduces the mixing of the second acid aqueous solution 113 into the alkaline aqueous solution used in the processing of step S25B. In this case, similar to the first water washing process, for example, as shown in FIG. 11, a cassette 100 holding several tens of to approximately a hundred semiconductor substrates 1 is immersed in water 114 that has been placed in the second water washing tank 104. The duration of immersion of the cassette in the water 114 may be, for example, 5 seconds or longer and within 60 seconds. The temperature of the water 114 may be, for example, approximately 15° C. or higher and 40° C. or lower. Instead of immersion in the water 114, the semiconductor substrates 1 may be water washed by using a shower apparatus or the like to pour water thereover. This reduces the mixture of the second acid aqueous solution 113 into the processing of the next process after the second water washing process.

The second water washing process may subject the semiconductor substrates 1 to water washing for a time that is longer than the time that the semiconductor substrates 1 are subjected to water washing in the first water washing process. That is, the water washing time T4 in the second water washing process may be longer than the water washing time T3 in the first water washing process, in which case the excessive growth of a stain film by the first water washing process is reduced. As a result, the decrease in the etching rate in the second etching process caused by the stain film is reduced.

Step S25B removes the stain film that has formed on the surface of the semiconductor substrate 1, by subjecting the semiconductor substrate 1 to treatment by an alkaline aqueous solution. In this case, the semiconductor substrate 1 may be immersed in the alkaline aqueous solution, and an aqueous solution containing at least one type of sodium hydroxide, potassium hydroxide, ammonium hydroxide, and sodium bicarbonate is used as the alkaline aqueous solution. More specifically, for example, a cassette holding at least one semiconductor substrate 1 may be immersed in an ammonium hydroxide aqueous solution that has been placed in a processing tank. In this case, the mass concentration of the ammonium hydroxide in the ammonium hydroxide aqueous solution may be, for example, 0.005% or greater and 5% or less. The duration of immersion of the cassette in the ammonium hydroxide aqueous solution may be approximately, for example, 5 seconds or longer and within 200 seconds. The temperature of the ammonium hydroxide aqueous solution may be approximately, for example, 10° C. or higher and 40° C. or lower.

Step S26B performs a third water washing process, in which the semiconductor substrate 1 is washed by water. Doing this reduces the mixture of the alkaline aqueous solution into the processing of the next process after the third water washing process. In this case, similar to the first and second water washing processes, for example, a cassette 100 holding several tens of to approximately a hundred semiconductor substrates 1 is immersed in water that has been placed in a water washing tank. The duration of immersion of the cassette in the water may be, for example, approximately 5 seconds or longer and within 60 seconds. The temperature of the water may be, for example, approximately 15° C. or higher and 40° C. or lower. Instead of immersion of the semiconductor substrates 1 into water, the semiconductor substrates 1 may be water washed by using a shower apparatus or the like to pour water thereover. This reduces the mixture of the alkaline aqueous solution into the processing of the next process after the third water washing process.

Step S27B performs treatment of the surface of the semiconductor substrate 1 by an acid aqueous solution. Doing this neutralizes alkaline aqueous solution that has become adhered to the semiconductor substrate 1 and removes the oxide film that has formed on the surface of the semiconductor substrate 1. In this case, a cassette 100 holding several tens of to approximately a hundred semiconductor substrates 1 is immersed into a dilute hydrofluoric acid aqueous solution having a mass concentration of hydrofluoric acid of 0.1% or higher and 25% or lower that has been placed in a processing tank. When this is done, the temperature of the hydrofluoric acid aqueous solution may be, for example, 10° C. or higher and 40° C. or lower. Similar to the third processing step, etching treatment by hydrofluoric acid and hydrochloric acid may be performed. A water washing process and a drying process may be adopted in the next process.

As noted above, according to the third embodiment of the uneven part forming process, after the semiconductor substrate 1 is immersed in the first acid aqueous solution 111 containing hydrofluoric acid, nitric acid, and sulfuric acid, it is immersed in the second acid aqueous solution 113 containing hydrofluoric acid and nitric acid but not substantially containing sulfuric acid, so as to form the uneven part 1aL. By doing this, it is difficult for the problem of the sulfur component included in the sulfuric acid ions becoming adhered to the surface of the semiconductor substrate 1 to occur. Specifically, in the semiconductor layer forming process to be described later, a sulfur component that is heated to a high temperature to diffuse it into the semiconductor substrate 1 makes it difficult for phenomenon of shortening of the lifetime of the semiconductor substrate 1 worsen the output characteristics of the solar cell element. Also, by forming the first electrodes 6 and the second electrodes 7 on the surface of the semiconductor substrate 1 on which sulfur ions have become adhered, it is difficult for the problem of a reduction in the intimate contact strength between the first electrodes 6 and the second electrodes 7 and the semiconductor substrate 1 to occur. As a result, the worsening of the output characteristics and the decrease of the reliability of the solar cell element 10 are reduced.

According to the third embodiment of the uneven part forming process, even if there is little damaged layer on the surface of the semiconductor substrate 1, a plurality of small depressed parts are formed by the first etching process, and each of the small depressed parts are expanded by the second etching process. By doing this, a preferable uneven part 1aL is formed on the first main surface 1a of the semiconductor substrate 1. Specifically, compared to the uneven part formed by an etching treatment using only the first acid aqueous solution 111, the width of the protruding parts in the uneven part 1aL are large. That is, an uneven part 1aL is formed that preferably decreases the reflection of light. The existence of this type of uneven part 1aL reduces the reflectivity of light on the light-receiving surface, so that light is efficiency captured into the solar cell element 10.

If the semiconductor substrate 1 is subjected to etching treatment by only the first acid aqueous solution 111, the time that is required for etching treatment up until the desired etched amount is obtained can become long. For this reason, to reduce the decrease in the rate of etching treatment, for example, new first acid aqueous solution 111 is generally added to the processing tank. However, if the number of semiconductor substrates 1 that are subjected to etching treatment by the first acid aqueous solution 111 becomes large, even if new first acid aqueous solution 111 is added to the processing tank, the etching treatment rate might decrease greatly, so that a preferred uneven part 1aL may not be formed.

In contrast, the third embodiment of the uneven part forming process performs a two-stage etching treatment by the first etching process using the first acid aqueous solution 111 and the second etching process using the second acid aqueous solution 113. As a result, the time of the etching treatment by the first acid aqueous solution 111 can become short. The result is that, even if the number of semiconductor substrates 1 that are subjected to etching treatment by the first acid aqueous solution 111 increases, the decrease in the etching treatment rate in the first etching process is reduced. As a result, an uneven part 1aL is formed that preferably reduces the reflection of light.

The third embodiment of the uneven part forming process may form an uneven part on the second main surface 1b side of the semiconductor substrate 1 as well.

<(3-4) Semiconductor Layer Forming Process>

The semiconductor layer forming process forms the second semiconductor layer 3 by using, for example, thermal diffusion. A specific embodiment of the semiconductor layer forming process is described below in detail.

The semiconductor layer forming process sequentially performs a process of forming a lamination part of the second semiconductor layer 3 and a glass layer on the first main surface 1a side of the semiconductor substrate 1 (also called the lamination part forming process), and a process of removing the glass layer (also called the glass layer removal process). In this case, the lamination part forming process uses, for example, thermal diffusion to form a lamination part of the lamination of the second semiconductor layer 3 and a glass layer disposed on the second semiconductor layer 3 in a region of the first main surface 1a side of the semiconductor substrate 1. The glass layer contains an element that serves as a dopant of the second conductivity type. The lamination part forming process may form a lamination part of the lamination of the second semiconductor layer 3 and the glass layer not only in a region on the first main surface 1a side of the semiconductor substrate 1, but also in a region on the second main surface 1b side of the semiconductor substrate 1. The glass layer removal process removes the glass layer using hydrofluoric acid and hydrochloric acid.

In the case in which a lamination part including the second semiconductor layer 3 and the glass layer is formed on the second main surface 1b side of the semiconductor substrate 1, a process of removing the lamination part on the second main surface 1b side (also called a lamination part removal process) may be performed after the lamination part forming process and before the glass layer removal process. Doing this removes the glass layer and the second semiconductor layer 3 that were formed in a region on the second main surface 1b side. In this case, by the series of processes performed by the glass layer removal process following the lamination part removal process, the productivity of the solar cell element 10 is improved.

Figure 12:
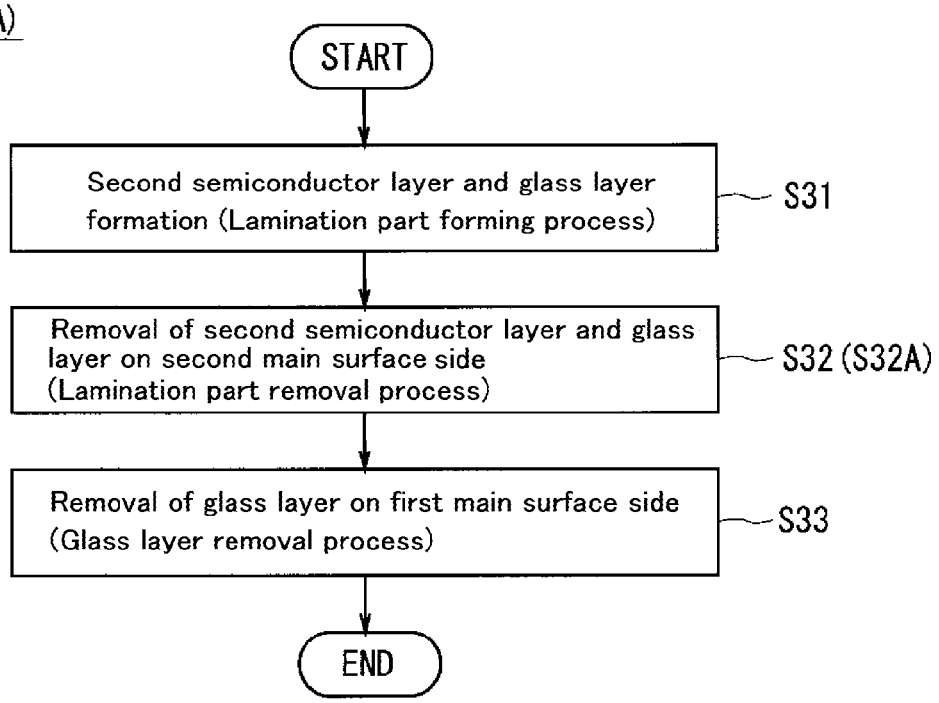
FIG. 12 is a flowchart showing a processing flow of a semiconductor layer forming process.

FIG. 12 is a flowchart showing an example of the processing flow in an embodiment of the semiconductor layer forming process. In this case, by sequentially performing steps S31 to S33, the second semiconductor layer 3 is formed on the first main surface 1a side of the semiconductor substrate 1, as shown in FIG. 12.

First, step S31 performs the lamination part forming process of forming on the semiconductor substrate 1 the second semiconductor layer 3 and a glass layer disposed on the second semiconductor layer 3. Step S32 performs the lamination part removal process of removing the lamination part that includes the second semiconductor layer 3 and the glass layer that were formed on the second main surface 1b side of the semiconductor substrate 1. Step S33 performs the glass layer removal process of removing the glass layer, using hydrofluoric acid and hydrochloric acid. Each of the processes in the embodiment of the semiconductor layer forming process is described in detail below.

<(3-4-1) Lamination Part Forming Process>

The lamination part forming process, for example, forms a second conductivity type second semiconductor layer 3 and a glass layer in a region on the first main surface 1a side of the semiconductor substrate 1. The second conductivity type may be, for example, n type. The lamination part forming process may form a second conductivity type second semiconductor layer 3 and a glass layer in a region on the second main surface 1b side of the semiconductor substrate 1.

The methods of forming the second semiconductor layer 3 include, for example, methods such as a coating and thermal diffusion method of coating $P_2O_5$ that has been made into a paste onto the surface of the semiconductor substrate 1, and then performing thermal diffusion, and the vapor-phase thermal diffusion method in which phosphorus oxychloride ($POCl_3$) that has been made into a gas is the diffusion source. The thickness of the second semiconductor layer 3 that is formed may be approximately 0.2 µm or greater and 2 µm or less. The thickness of the second semiconductor layer 3 is substantially equivalent to the depth of formation of the second semiconductor layer 3 from the surface of the semiconductor substrate 1. The sheet resistance of the second semiconductor layer 3 may be approximately 40Ω/□ or greater and 200Ω/□ or less.

More specifically, for example, when the vapor-phase thermal diffusion method is used, the semiconductor substrate 1 is subjected to thermal treatment in an atmosphere containing as the diffusion gas mainly $POCl_3$ and the like, in a temperature range that is approximately 600° C. or higher and 800° C. or lower. The duration of this heat treatment may be approximately 5 minutes or longer and 30 minutes or shorter. This thermal treatment forms, in a region near the surface of the semiconductor substrate 1, a glass layer containing phosphorus as an element that will serve as an n-type conductivity dopant. The glass layer containing phosphorus may contain mainly a phosphorus glass layer. After the thermal treatment, for example, the semiconductor substrate 1 may be subjected to a next thermal treatment in a high temperature range of approximately 800° C. or higher and 900° C. or lower, in an atmosphere of an inert gas such as argon and nitrogen, or one of oxygen. The duration of the thermal treatment may be approximately 10 minutes or longer and within 40 minutes. This thermal treatment diffuses phosphorus from the phosphorus glass in the glass layer into the semiconductor substrate 1, forming a second semiconductor layer 3 below the glass layer. As a result, the second semiconductor layer 3 and a glass layer containing mainly phosphorus glass disposed on the second semiconductor layer 3 are formed in at least a region on the first main surface 1a side of the semiconductor substrate 1.

<(3-4-2) Lamination Part Removal Process>

The lamination part removal process uses, for example, an acid aqueous solution containing hydrofluoric acid and nitric acid (also called the second mixed acid aqueous solution) to remove the lamination part including the glass layer and the second semiconductor layer 3 formed on the second main surface 1b side of the semiconductor substrate 1. Doing this exposes the first conductivity type first semiconductor layer 2 on the second main surface 1b of the semiconductor substrate 1. The first conductivity type may be, for example, p type.

In the above-noted semiconductor layer forming process, for example, a case can be envisioned in which, in the condition in which a mask is disposed on the second main surface 1b of the semiconductor substrate 1 beforehand, vapor-phase thermal diffusion is used to form the second semiconductor layer 3, after which the diffusion mask is removed. Even if this type of semiconductor layer forming process is used, the semiconductor substrate 1 can have the same structure as after performing the lamination part removal process. In this case, because the second semiconductor layer 3 and the glass layer are not formed on the second main surface 1b side of the semiconductor substrate 1, the lamination part removal process is not necessary.

A first and a second embodiment of the lamination part removal processes are described by examples below.

<(3-4-2-1) First Embodiment of the Lamination Part Removal Process>

The first embodiment of the lamination part removal process performs wet etching treatment using the second mixed acid aqueous solution and treatment using an alkaline aqueous solution.

Figure 13:
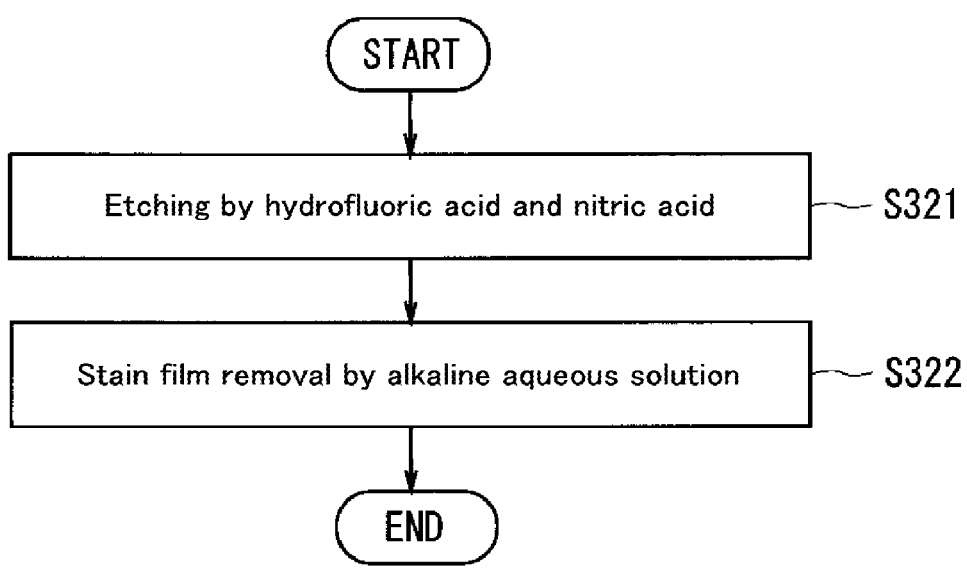
FIG. 13 is a flowchart showing a processing flow of a first embodiment of a lamination part removal process.

FIG. 13 is a flowchart showing an example of the processing flow in the first embodiment of the lamination part removal process. As shown in FIG. 13, the first embodiment of the lamination part removal process sequentially performs the processing of steps S321 to S322, so as to remove the lamination part including a glass layer and the second semiconductor layer 3 formed in a region on the second main surface 1b side of the semiconductor substrate 1.

Step S321 performs an etching process using the second mixed acid aqueous solution containing hydrofluoric acid and nitric acid. Specifically, it uses the second mixed acid aqueous solution to perform etching that removes the lamination part including the glass layer and the second semiconductor layer 3 formed in a region on the second main surface 1b side of the semiconductor substrate 1. More specifically, for example, it immerses the second main surface 1b side of the semiconductor substrate 1 into a fluonitric acid aqueous solution as the second mixed acid aqueous solution, thereby removing the glass layer and the second semiconductor layer 3 that were formed on the second main surface 1b side of the semiconductor substrate 1.

When this is done, in the condition in which phosphorus glass remains as a glass layer on the first main surface 1a side of the semiconductor substrate 1, the glass layer and the second semiconductor layer 3 that were formed on the second main surface 1b side of the semiconductor substrate 1 are removed. Doing this, the existence of phosphorus glass as a glass layer disposed on the first main surface 1a side of the semiconductor substrate 1 reduces the removal of and the damage imparted to the second semiconductor layer 3 disposed on the first main surface 1a side of the semiconductor substrate 1.

In addition to hydrofluoric acid and nitric acid, the second mixed acid aqueous solution may contain sulfuric acid. That is, the etching process of step S321 may use a second mixed acid aqueous solution containing hydrofluoric acid, nitric acid, and sulfuric acid to subject a lamination part including the glass layer and the second semiconductor layer 3 that were formed in a region on the second main surface 1b side of the semiconductor substrate to etching treatment. When this occurs, the viscosity of the second mixed acid aqueous solution might increase, making it difficult for the problem to occur of the second mixed acid aqueous solution spraying so that the second mixed acid aqueous solution becomes adhered to the first main surface 1a side of the semiconductor substrate 1. As a result, there is a further reduction of the removal of and damage imparted to the second semiconductor layer 3 disposed on the first main surface 1a side of the semiconductor substrate 1.

Step S322 uses an alkaline aqueous solution to perform a process of treating the second main surface 1b (also called the first alkaline treatment processing step). This process, for example, immerses the semiconductor substrate 1 in an alkaline aqueous solution. In this case, an alkaline aqueous solution containing at least one type of sodium hydroxide, potassium hydroxide, ammonium hydroxide, and sodium bicarbonate may be used as the alkaline aqueous solution. More specifically, for example, the second main surface 1b side of the semiconductor substrate 1 may be immersed in a potassium hydroxide aqueous solution as the alkaline aqueous solution. In this case, the mass concentration of the potassium hydroxide in the potassium hydroxide aqueous solution may be, for example, 1% or greater and 20% or less. The duration of immersion of the cassette in the potassium hydroxide aqueous solution may be, for example, approximately 5 seconds or longer and within 120 seconds. The temperature of the potassium hydroxide aqueous solution may be, for example, approximately 10° C. or higher and 40° C. or lower.

The first alkaline treatment processing step removes the stain film formed on the second main surface 1b side of the semiconductor substrate 1 by the etching process of step S321. For this reason, there could be a condition in which there is no stain film interposed between the second electrodes 7, which are formed in an electrode forming process that is a process after the semiconductor layer forming process, and the semiconductor substrate 1. As a result, it is difficult for the problem to occur in which a stain film interposed between the second electrodes 7 and the semiconductor substrate 1 reduces the intimate contact strength between the semiconductor substrate 1 and the second electrodes 7. The worsening of the output characteristics and the decrease in the reliability of the solar cell element 10 are therefore reduced.

<(3-4-2-2) Second Embodiment of the Lamination Part Removal Process>

The second embodiment of the lamination part removal process, after performing the same type of etching treatment as in above-noted first embodiment of the lamination part removal process, performs a water washing process of washing the semiconductor substrate 1 with water. If a stain film is formed on the surface of the semiconductor substrate 1 after the water washing process, a first alkaline treatment processing step similar to the above-noted first embodiment of the lamination part removal process may be performed. Additionally, after the first alkaline treatment processing step, a water washing process of washing the semiconductor substrate 1 with water may be performed.

Figure 14:
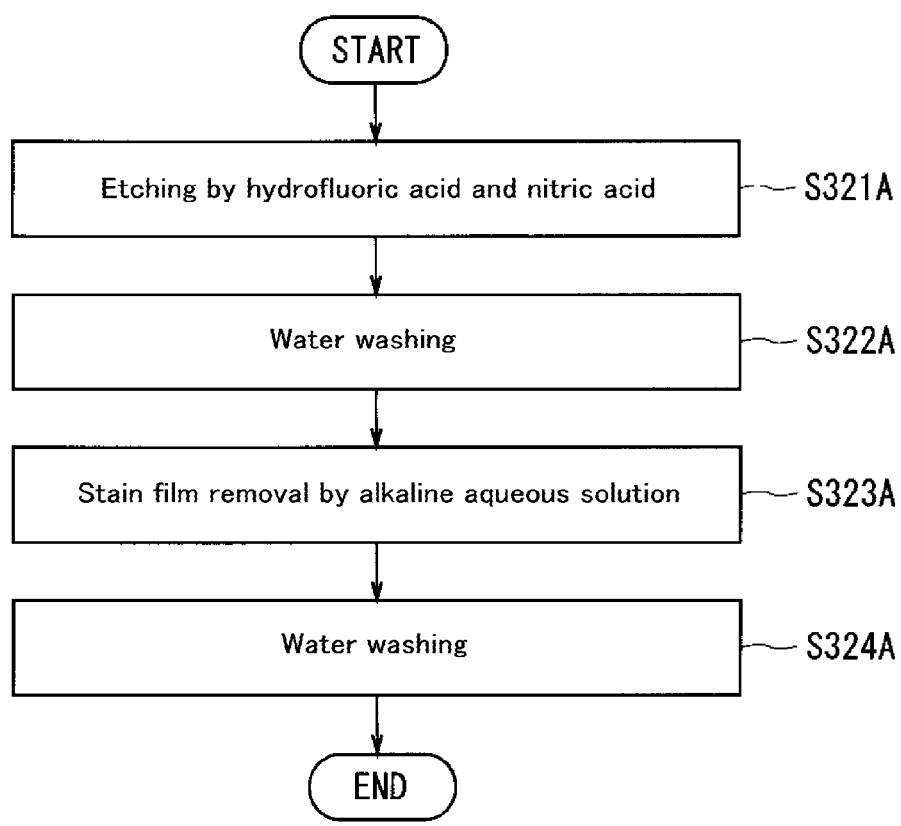
FIG. 14 is a flowchart showing a processing flow of a second embodiment of a lamination part removal process.

FIG. 14 is a flowchart showing an example of the flow of processing in the second embodiment of the lamination part removal process. In the second embodiment of the lamination part removal process, instead of the step S32 that performs the processing of the above-noted steps S321 to S322 shown in FIG. 14, a step S32A that sequentially performs the processing of steps S321A to 324A is performed. Doing this removes the lamination part that includes the glass layer and the second semiconductor layer 3 that were formed in a region on the second main surface 1b side of the semiconductor substrate 1.

First, step S321A performs an etching process that is the same as that of step S321 of FIG. 13. That is, a second mixed acid aqueous solution containing hydrofluoric acid and nitric acid is used to perform etching treatment that removes a lamination part including the glass layer and the second semiconductor layer 3 that were formed in a region on the second main surface 1b side of the semiconductor substrate 1.

Step S322A performs a water washing process that washes the semiconductor substrate 1 with water. In this water washing process, for example, a cassette holding one or more semiconductor substrates 1 may be immersed into water placed in a water washing processing tank. In this case, the duration of immersion of the cassette into the water may be, for example, approximately 5 seconds or longer and within 60 seconds. The water temperature may be, for example, approximately 15° C. or higher and 40° C. or lower. Instead of immersing the semiconductor substrates 1 in water, for example, the semiconductor substrate 1 may be water washed by using a shower apparatus or the like to pour water thereover. This reduces the mixture of the second mixed acid aqueous solution into the next process after the etching process.

Step S323A performs a first alkaline processing step that is the same as that of step S322 of FIG. 13. Doing this removes the stain film that was formed on the second main surface 1b side of the semiconductor substrate 1 in the etching process of the above-noted step S321A.

Step S324A performs a water washing process that washes the semiconductor substrate 1 with water. In this water washing process, similar to the water washing process in the above-noted step S322A, for example, a cassette holding one or more semiconductor substrates 1 may be immersed into water placed in a water washing processing tank. In this case, the duration of immersion of the cassette into water may be, for example, approximately 5 seconds or longer and within 60 seconds. The water temperature may be, for example, approximately 15° C. or higher and 40° C. or lower. Instead of immersing the semiconductor substrate 1 in water, for example, the semiconductor substrate 1 may be water washed by using a shower apparatus or the like to pour water thereover. This reduces the mixture of the second mixed acid aqueous solution into the next process after the first alkaline processing step.

<(3-4-3) Glass Layer Removal Process>

The glass layer removal process performs etching treatment using, for example, hydrofluoric acid and hydrochloric acid. The etching treatment, for example, may perform wet etching treatment using an acid aqueous solution (also called the first mixed acid aqueous solution) containing hydrofluoric acid and hydrochloric acid. The etching treatment may, for example, be etching treatment using hydrofluoric acid steam and hydrochloric acid steam. Doing this removes the glass layer disposed on the first main surface 1a side of the semiconductor substrate 1, exposing second conductivity type second semiconductor layer 3 on the first main surface 1a of the semiconductor substrate 1. The second conductivity type may be, for example, n type.

In this glass layer removal process, sodium ions and potassium ions adhered to the semiconductor substrate 1 at the time of the treatment with alkaline aqueous solution in the lamination part removal process, along with metal ions such as iron ions existing in the surface vicinity of the semiconductor substrate 1, are removed by hydrochloric acid. As a result, the possibility of metallic impurities diffusing in the semiconductor substrate 1 is reduced. Therefore, the decrease in the conversion efficiency of the solar cell element 10 is further reduced, and a solar cell element 10 having good output characteristics is achieved.

First and second embodiments of the glass layer removal process are described below by examples.

<(3-4-3-1) First Embodiment of the Glass Layer Removal Process>

The first embodiment of the glass layer removal process performs wet etching treatment using a first mixed acid aqueous solution containing hydrofluoric acid and hydrochloric acid.

Figure 15:
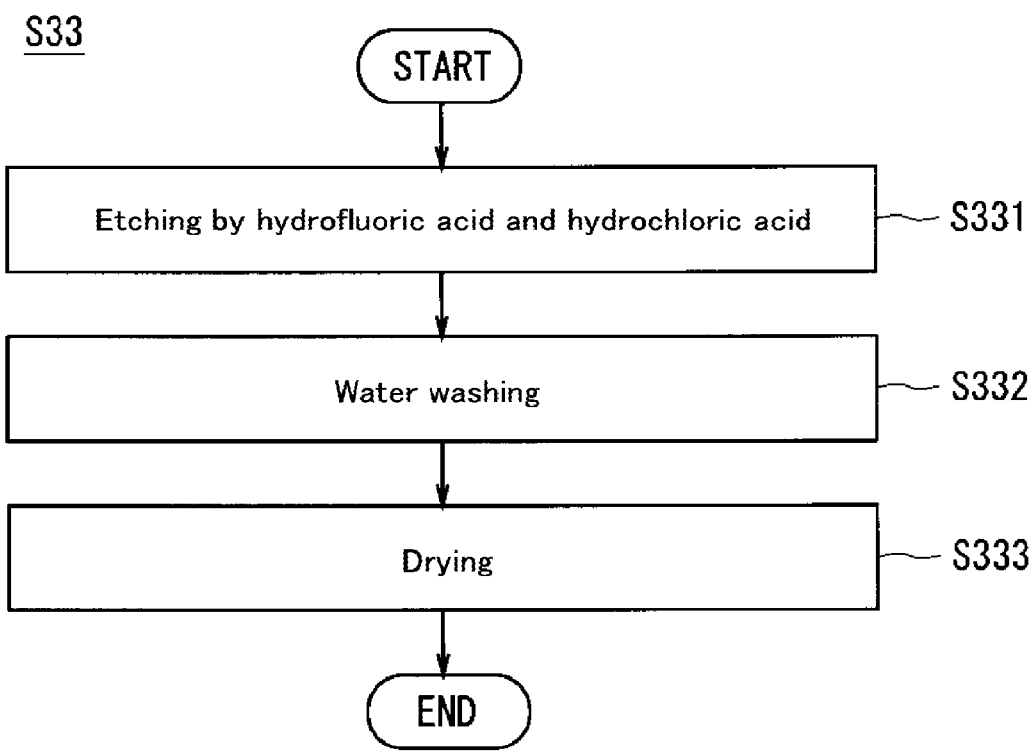
FIG. 15 is a flowchart showing a processing flow of a glass layer removal process.

FIG. 15 is a flowchart showing an example of the processing flow of the first embodiment of the glass layer removal process. The first embodiment of the glass layer removal process, as shown in FIG. 15, sequentially performs the processing of steps S331 to S333, thereby removing the glass layer that was formed on the first main surface 1a side of the semiconductor substrate 1.

First, step S331 performs etching treatment by hydrofluoric acid and hydrochloric acid. Doing this removes the glass layer disposed on the first main surface 1a side of the semiconductor substrate 1. The glass layer may be, for example, phosphorus glass or the like.

More specifically, for example, by treating the first main surface 1a side of the semiconductor substrate 1 by a first mixed acid aqueous solution containing hydrofluoric acid and hydrochloric acid, the glass layer disposed on the first main surface 1a side of the semiconductor substrate 1 is removed. For example, a cassette holding from several tens to approximately a hundred semiconductor substrates 1 is immersed in the first mixed acid aqueous solution placed in a processing tank. When this is done, for example, the semiconductor substrates 1 may be immersed in the first mixed acid aqueous solution so that the first main surface 1a of the semiconductor substrates 1 and the fluid surface of the first mixed acid aqueous solution are substantially perpendicular. The method of immersing the semiconductor substrates 1 into the first mixed acid aqueous solution is not restricted to the method of immersing the above-described cassette into the first mixed acid aqueous solution and, for example, can be selected as appropriate to the etching apparatus and the shape and the like of the semiconductor substrates 1.

The use of the first mixed acid aqueous solution in the etching treatment, compared to the case of removing the glass layer by only hydrofluoric acid, achieves a solar cell element 10 having good output characteristics. In this case, because the first mixed acid aqueous solution used in removing the glass layer contains hydrochloric acid, by the high reactivity of chloride ions, the efficiency of removal of metallic ions existing in the vicinity of the surface of the semiconductor substrate 1 can increase. That is, the efficiency of removal of metallic elements existing in the vicinity of the surface of the semiconductor substrate 1 can increase. Also, in the first mixed acid aqueous solution, the presence of hydrochloric acid achieves a low pH. As a result, the solubility of metallic ions in the first mixed acid aqueous solution is large. This makes it difficult for metallic ions existing in the first mixed acid aqueous solution to become adhered to the surface of the semiconductor substrate 1. As a result of these actions, the metallic elements mixing into the semiconductor substrate 1 are reduced, and good output characteristics in the solar cell element 10 are achieved.

The first mixed acid aqueous solution, for example, may be a mixture of a hydrofluoric acid aqueous solution having a mass concentration of 46% of hydrofluoric acid, a hydrochloric acid aqueous solution having a mass concentration of 35% of hydrochloric acid, and water. The volume ratio of the hydrofluoric acid aqueous solution having a mass concentration of 46% of hydrofluoric acid, the hydrochloric acid aqueous solution having a mass concentration of 35% of hydrochloric acid, and water that are mixed may be, for example, 1:0.01 to 0.5:5. That is, the ratio between the mass concentration of hydrofluoric acid and the mass concentration of the hydrochloric acid in the first mixed acid aqueous solution may be, for example, 2 to 100:1. Additionally, stated differently, in the first mixed acid aqueous solution, the mass concentration of the hydrofluoric acid may be two times or greater and 100 times or less the mass concentration of the hydrochloric acid. As a result, excessive attacking of the surface of the second semiconductor layer 3 by chloride ions is reduced, while maintaining the efficiency of removing metallic elements existing in the vicinity of the surface of the semiconductor substrate 1 and the effect of reducing the adhesion of metallic elements to the surface of the semiconductor substrate 1. As a result, a preferable surface profile is achieved on the first main surface 1a of the semiconductor substrate 1, and also a solar cell element 10 having further good output characteristics is achieved. The temperature of the first mixed acid aqueous solution used in performing the etching treatment may be, for example, approximately 15° C. or higher and 40° C. or lower. The duration of immersion of the semiconductor substrates 1 in the first mixed acid aqueous solution may be, for example, approximately 10 seconds or longer and within 180 seconds.

In step S331, instead of subjecting the first main surface 1a side of the semiconductor substrate 1 to etching treatment by the first mixed acid aqueous solution, the first main surface 1a side of the semiconductor substrate 1 may be sequentially subjected to, for example, etching treatment by a hydrofluoric acid aqueous solution, and etching treatment by a hydrochloric acid aqueous solution.

Step S332 performs a water washing process that washes the semiconductor substrate 1 with water. In this water washing process, for example, a cassette holding one or more semiconductor substrates 1 may be immersed in water that has been placed in a water washing processing tank. In this case, the duration of immersion of the cassette in the water may be, for example, approximately 5 seconds or longer and within 60 seconds. The temperature of the water may be, for example, approximately 15° C. or higher and 40° C. or lower. Instead of immersion of the semiconductor substrates 1 in water, for example, the semiconductor substrates 1 may be water washed by using a shower apparatus or the like to pour water thereover. In this case, by subjecting the semiconductor substrate 1 to etching treatment using the above-noted first mixed acid aqueous solution, the water repellency at the surface of the semiconductor substrate 1 can be improved.

Step S333 performs a drying process that dries semiconductor substrates 1. For example, by blowing nitrogen gas or air at a high pressure from a spray nozzle onto the surfaces of the semiconductor substrates 1, the semiconductor substrates 1 are dried. When this is done, good water repellency at the surface of the semiconductor substrates 1 facilities the drying. This results in a reduction in the occurrence of water marks on the surface of the semiconductor substrate 1. Another method that may be used to dry the semiconductor substrates 1 is, for example, the method of using the centrifugal force of rotation in a centrifugal dryer to spin away water droplets and dry the semiconductor substrates 1.

<(3-4-3-2) Second Embodiment of the Glass Layer Removal Process>

The second embodiment of the glass layer removal process removes the glass layer disposed on the first main surface 1a side of the semiconductor substrate 1 by etching treatment using steam containing an acid. Because the processes in the second embodiment of the glass layer removal process other than the etching treatment are the same as the processes other than the etching treatment in the above-noted first embodiment of the glass layer removal process, the descriptions thereof will not be repeated.

In this case, for example, the first and second removal methods shown below are used as the method for removing the glass layer disposed on the first main surface 1a side of the semiconductor substrate 1 using etching treatment by steam containing an acid.

First, the first removal method is the method of removing the glass layer disposed on the first main surface 1a side of the semiconductor substrate 1 by exposing the first main surface 1a side of the semiconductor substrate 1 to steam containing hydrofluoric acid and hydrochloric acid. In this case, for example, a cassette holding one or more semiconductor substrates 1 is placed in a processing chamber, and steam containing hydrofluoric acid and hydrochloric acid is sent into the processing chamber. Doing this removes the glass layer disposed on the first main surface 1a side of the semiconductor substrate 1 by etching treatment. In this case, the steam containing hydrofluoric acid and hydrochloric acid is generated, for example, by heating a first mixed acid aqueous solution containing hydrofluoric acid and hydrochloric acid. The steam containing hydrofluoric acid and hydrochloric acid may be generated by another method, for example, by blowing into and passing a carrier gas through a first mixed acid aqueous solution containing hydrofluoric acid and hydrochloric acid. In this case, etching treatment is performed using the first mixed acid aqueous solution containing hydrofluoric acid and hydrochloric acid.

The first mixed acid aqueous solution, for example, may be a mixture of a hydrofluoric acid aqueous solution having a mass concentration of 49% of hydrofluoric acid and a hydrochloric acid aqueous solution having a mass concentration of 35% of hydrochloric acid. The volume ratio of the hydrofluoric acid aqueous solution having mass concentration of 49% of hydrofluoric acid and a hydrochloric acid aqueous solution having a mass concentration of 35% of hydrochloric acid that are mixed may be, for example, 10 to 4:1. The first main surface 1a side of the semiconductor substrate 1 is exposed to steam generated by the introduction of air into the tank, in which the first mixed acid aqueous solution is placed and is disposed in the chamber. In this case, the duration of exposure of the first main surface 1a side of the semiconductor substrate 1 to steam may be, for example, 10 seconds or longer and within 300 seconds. The temperature within the chamber may be, for example, a normal temperature of approximately 25° C. Doing the above removes the glass layer disposed on the first main surface 1a side of the semiconductor substrate 1.

Next, the second removal method may be a method which, instead of performing etching treatment by stream generated from the first mixed acid aqueous solution, for example, separately performs etching treatment by hydrofluoric acid steam and etching treatment by hydrochloric acid steam. Specifically, for example, first a first treatment is performed to expose the first main surface 1a side of the semiconductor substrate 1 to steam containing hydrofluoric acid. This removes the glass layer disposed on the first main surface 1a side of the semiconductor substrate 1. After that, a second treatment is performed to expose the first main surface 1a side of the semiconductor substrate 1 to steam containing hydrochloric acid.

In the first treatment, for example, a cassette holding one or more semiconductor substrates 1 is placed in a first processing chamber, and steam containing hydrofluoric acid is sent into the first processing chamber. Doing this removes the glass layer disposed on the first main surface 1a side of the semiconductor substrates 1 by etching treatment. In this case, the steam containing hydrofluoric acid is generated, for example, by heating a hydrofluoric acid aqueous solution. Additionally, the steam containing hydrofluoric acid may be generated by another method, such as blowing into and passing a carrier gas through a hydrofluoric acid aqueous solution.

The second treatment that follows, for example, places a cassette holding one or more semiconductor substrates 1 into a second processing chamber, and sends steam containing hydrochloric acid into the second processing chamber. Doing this removes various metallic ions existing in the vicinity of the surface of the semiconductor substrate 1. In this case, the steam containing hydrochloric acid may be generated, for example, by heating a hydrochloric acid aqueous solution. Additionally, the steam containing hydrochloric acid may be generated by another method, such as blowing into and passing a carrier gas through a hydrochloric acid aqueous solution. In this case, etching treatment is performed by a hydrofluoric acid aqueous solution and by a hydrochloric acid aqueous solution.

Specifically, in the first treatment, the first main surface 1$a$ side of the semiconductor substrate 1 is exposed to steam generated by introducing air into a tank, disposed in the chamber, into which a hydrofluoric acid aqueous solution having a mass concentration of 49% of hydrofluoric acid is placed. When this is done, the duration of exposure of the first main surface 1$a$ side of the semiconductor substrate 1 to the steam may be, for example, 10 seconds or longer and within 200 seconds. The temperature within the chamber may be a normal temperature of, for example, approximately 25° C. Doing the above removes the glass layer disposed on the first main surface 1$a$ side of the semiconductor substrate 1. Next, in the second treatment, the first main surface 1$a$ side of the semiconductor substrate 1 is exposed to the steam generated by introducing air into a tank, disposed in the chamber, into which a hydrochloric acid aqueous solution having a mass concentration of 35% of hydrochloric acid is placed. When this is done, the duration of exposure of the first main surface 1$a$ side of the semiconductor substrate 1 to steam may be, for example, 10 seconds or longer and within 200 seconds. The temperature within the chamber may be, for example, a normal temperature of, for example, approximately 25° C.

<(3-5) Anti-Reflection Layer Forming Process>

The anti-reflection layer forming process first forms the anti-reflection layer 5 on the first main surface 1$a$ side of the semiconductor substrate 1. That is, it forms the anti-reflection layer 5 on the second semiconductor layer 3. In this case, the method of forming the anti-reflection layer 5 is, for example, a method such as PECVD (plasma-enhanced chemical vapor deposition), vapor deposition, or sputtering. If PECVD is used, a gas mixture of, for example, silane ($SiH_4$) and ammonia ($NH_3$) is diluted with nitrogen ($N_2$), followed by the formation of a plasma by glow discharge decomposition, resulting in deposition of mainly silicon nitride. Doing this forms a film containing mainly silicon nitride as the anti-reflection layer 5. In this case, the temperature in the reaction chamber in which the plasma of the gas is formed by glow discharge decomposition may be, for example, approximately 500° C.

<(3-6) High-Concentration Diffusion Layer Forming Process>

The high-concentration diffusion layer forming process forms a third semiconductor layer 4 by high-concentration diffusion of a first conductivity type impurity element into the second main surface 1$b$ side of the semiconductor substrate 1.

The method of forming the third semiconductor layer 4 is, for example, the following first forming method and second forming method.

The first forming method uses, for example, tribromate boron ($BBr_3$) as the diffusion source, and performs thermal diffusion in a temperature range of approximately 800° C. or higher and 1100° C. or lower. This forms the third semiconductor layer 4 on the second main surface 1$b$ side of the semiconductor substrate 1.

The second forming method, for example, applies an aluminum paste containing mainly an aluminum powder and an organic vehicle on the second main surface 1$b$ of the semiconductor substrate 1, followed by firing of the aluminum paste in a temperature range of 600° C. or higher and 850° C. or lower. Doing this causes diffusion of aluminum into the semiconductor substrate 1. This forms the third semiconductor layer 4 on the second main surface 1$b$ side of the semiconductor substrate 1.

By using the second forming method, a region (also called a diffusion region) is formed into which aluminum is selectively diffused, in a region in the vicinity of the surface on the second main surface 1$b$ of the semiconductor substrate 1 onto which an aluminum paste has been applied. Even if the second semiconductor layer 3 is formed on the second main surface 1$b$ side of the semiconductor substrate 1 by the above-noted semiconductor layer forming process, by applying the aluminum paste from above the second semiconductor layer 3 on the second main surface 1$b$ side and then firing it, the second semiconductor layer 3 is replaced by the third semiconductor layer 4 on the second main surface 1$b$. For this reason, the lamination part removal process that removes the second semiconductor layer 3 on the second main surface 1$b$ side is not necessary. As a result, the process for manufacturing the solar cell element 10 can be simplified. In this case, the glass layer on the first main surface 1$a$ side and the second main surface 1$b$ side of the semiconductor substrate 1 may be removed in the above-noted glass layer removal process. In this case, for example, a laser or the like may be used to from a groove part to provide p-n isolation in the peripheral part of the first main surface 1$a$ side or the second main surface 1$b$ side of the semiconductor substrate 1.

<(3-7) Electrode Forming Process>

The electrode forming process forms the first electrodes 6, which include the first output lead-out electrodes 6$a$ and the first collector electrodes 6$b$, and the second electrodes 7, which include the second output lead-out electrodes 7$a$ and the second collector electrodes 7$b$. The method adopted for forming the first electrodes 6 and the second electrodes 7 is, for example, the forming method given below.

The first electrodes 6 are formed using an electrically conductive paste containing a metal powder containing, for example, mainly silver (Ag), an organic vehicle, and glass frit. In this case, the electrically conductive paste is applied on the first main surface 1$a$ of the semiconductor substrate 1, followed by thermal firing treatment of the electrically conductive paste at a maximum temperature of 600° C. or higher and 850° C. or lower for a time that is approximately several tens of seconds or longer and within several tens of minutes. Doing this forms the first electrodes 6. In this case, the method for applying the electrically conductive paste is, for example, screen printing or the like. After the electrically conductive paste is applied onto the first main surface 1$a$ of the semiconductor substrate 1, a drying process that causes the solvent component of the electrically conductive paste to evaporate may be performed at a pre-established temperature. By adopting this screen printing method, the first output lead-out electrodes 6a and the first collector electrodes 6b are formed by one process, rather than being formed separately.

The second collector electrodes 7b are formed using, for example, an aluminum paste containing an aluminum power and an organic vehicle. In this case, the aluminum paste is applied over the entire surface, with the exception of one part of the part of the second main surface 1b of the semiconductor substrate 1 in which the second output lead-out electrodes 7a are formed. In this case, the method used for applying the aluminum paste is, for example, the screen printing method or the like. After the aluminum paste is applied on the second main surface 1b of the semiconductor substrate 1, a drying process that causes the solvent component of the aluminum paste to evaporate may be performed at a pre-established temperature. By doing this, it is difficult in processes following the drying process for the aluminum paste to become adhered to various parts other than the parts to which it is to be applied. For this reason, the ease of working in the various processes after the drying process can be improved. The second collector electrodes 7b may be formed by firing the aluminum paste in the high-concentration diffusion layer forming process.

The second output lead-out electrodes 7a are formed using a silver paste containing a metal powder containing mainly silver powder and the like, an organic vehicle, and glass frit. In this case, for example, after applying the above-noted aluminum paste onto the second main surface 1b of the semiconductor substrate 1, the silver paste is applied to form a pre-established pattern on the second main surface 1b of the semiconductor substrate 1. When this is done, the silver paste is applied in positions that makes contact with parts of the aluminum paste for forming the second collector electrodes 7b. By doing this, the second output lead-out electrodes 7a are formed so as to overlap with a part of the second collector electrodes 7b. In this case, the method used for applying the silver paste is, for example, the screen printing method or the like. After applying the silver paste on the second main surface 1b of the semiconductor substrate 1, a drying process that causes the solvent component of the silver paste to evaporate may be performed at a pre-established temperature.

Then, the semiconductor substrate 1 to which the aluminum paste and the silver paste have been applied is subjected to thermal treatment in a firing oven at a maximum temperature of 600° C. or higher and 850° C. or lower, for a time that is approximately several tens of seconds or longer and within several tens of minutes. By doing this, the second electrodes 7 are formed by the firing of the aluminum paste and the silver paste.

Although the description has been for the method of forming the first and second electrodes 6 and 7 using printing and firing, the first and second electrodes 6 and 7 may be formed by another method, such as vapor deposition, sputtering, or plating and the like.

(4) SUMMARY OF THE EMBODIMENTS

As described above, according to one embodiment of a method for manufacturing the solar cell element 10, for example, sequentially performing a first etching treatment by a first acid aqueous solution and a second etching treatment by a second acid aqueous solution forms the above-noted preferable uneven part 1aL. Doing this reduces the reflectivity of light at the light-receiving surface and achieves a solar cell element 10 capable of efficiently capturing light into the inside thereof. As a result, the short-circuit current density is improved, and a solar cell element 10 having good output characteristics is achieved. That is, a solar cell module 20 having good output characteristics is achieved.

According to one embodiment of a method of manufacturing the solar cell element 10, for example, using etching treatment by hydrofluoric acid and hydrochloric acid in the glass layer removal process reduces the metallic elements mixed into the semiconductor substrate 1. This facilitates the achievement of a solar cell element 10 having good output characteristics with a low manufacturing cost. That is, this facilitates the achievement of a solar cell module 20 having good output characteristics. Even if the uneven part 1aL is not formed on the first main surface 1a of the semiconductor substrate 1 in the uneven part forming process, reducing the metallic elements mixing into the semiconductor substrate 1 facilitates the achievement of a solar cell element 10 having good output characteristics. However, the uneven part forming process that forms the uneven part 1aL on the first main surface 1a of the semiconductor substrate 1 before the semiconductor layer forming process achieves a solar cell element 10 with even better output characteristics.

According to one embodiment of a manufacturing method for the solar cell element 10, the glass layer and the second semiconductor layer 3 on the second main surface 1b side of the semiconductor substrate 1 are removed by the lamination part removal process before the glass layer removal process. For this reason, in the lamination part removal process, the existence of a glass layer on the first main surface 1a side of the semiconductor substrate 1 reduces the removal of and the damage imparted to the second semiconductor layer 3 disposed on the first main surface 1a side of the semiconductor substrate 1.

(5) VARIATION EXAMPLES

The present invention is not restricted to the above-noted embodiments and can, as described below, be subjected to many corrections and modifications within the scope thereof.

For example, in the electrode forming process, the electrically conductive paste applied on the first main surface 1a of the semiconductor substrate 1, as well as the aluminum paste and sliver paste that are applied on the second main surface 1b of the semiconductor substrate 1 may be fired in the same process.

Also, a passivation film may be provided on the second main surface 1b side of the semiconductor substrate 1. This passivation film can play the role of reducing carrier recombination on the second main surface 1b, which is the rear surface of the semiconductor substrate 1. For example, a silicon-based nitride film, a silicon oxide ($SiO_2$) film, an aluminum oxide ($Al_2O_3$) film, or a titanium oxide ($TiO_2$) film or the like is used as the passivation film. In this case, examples of silicon-based nitride films are a silicon nitride ($Si_3N_4$) film and an amorphous silicon nitride (a-$SiN_x$) film. The thickness of the passivation film may be, for example, approximately 10 nm or greater and 200 nm or less. The method used to form the passivation film may be PECVD, vapor deposition, or sputtering or the like. In this manner, a structure used in a PERC (passivated emitter and rear cell) structure or a structure used in a PERL (passivated emitter rear locally diffused) structure may be used as a structure on the second main surface 1b side of the semiconductor substrate 1. If the passivation film and the anti-reflection layer 5 are formed by one and the same film, the passivation film is formed by a process that is the same as the process whereby the anti-reflection layer 5 is formed.

Even in the case in which the second semiconductor layer 3 is a semiconductor layer exhibiting p-type conductivity and containing boron, boron glass as the glass layer is removed by etching treatment by a process that is the same as the above-noted glass layer removal process.

A back-contact type structure may be adopted, in which the first output lead-out electrodes 6a are disposed on the second main surface 1b side of the semiconductor substrate 1, in which case an electrically conductive part passing through the semiconductor substrate 1 is provided, so that there is electrical connection between the electrically conductive part and the first collector electrodes 6b disposed on the first main surface 1a of the semiconductor substrate 1, and also electrical connection between the electrically conductive part and the first output lead-out electrodes 6a disposed on the second main surface 1b side of the semiconductor substrate 1.

EXAMPLES (A) First Example

A first example of the method for manufacturing the solar cell element 10 according to an embodiment is described below. The referenced drawings are FIG. 1 to FIG. 3.

First, a polycrystalline silicon ingot was thinly sliced using a fixed abrasive type wire saw apparatus, to prepare a polycrystalline silicon substrate having a thickness of 220 μm, as a square sheet 156 mm on a side, and having a resistivity of 1.5 Ω·cm as the semiconductor substrate 1. The surface of the polycrystalline silicon substrate was then washed.

Next, an uneven part 1aL was formed on the first main surface 1a of the semiconductor substrate 1. The uneven part 1aL was formed by three forming methods having the following three conditions 1 to 3. In the forming method of condition 1, the semiconductor substrate 1 was subjected to etching treatment by only the above-noted first etching process. That is, in the forming method of condition 1, the uneven part 1aL was formed by subjecting the semiconductor substrate 1 to etching treatment by the first acid aqueous solution 111 containing hydrofluoric acid, nitric acid, and sulfuric acid. In the forming method of the condition 2, the semiconductor substrate 1 was subjected to etching treatment by only the above-noted second etching process. That is, in the forming method of condition 2, the uneven part 1aL was formed by subjecting the semiconductor substrate 1 to etching treatment by the second acid aqueous solution 113, which contains hydrofluoric acid and nitric acid but does not substantially contain sulfuric acid. In the forming method of the condition 3, after the semiconductor substrate 1 was subjected to etching treatment by the above-noted first etching process, the semiconductor substrate 1 was subjected to etching treatment by the above-noted second etching process. That is, in the forming method of condition 3, the uneven part 1aL was formed by subjecting the semiconductor substrate 1 to etching treatment by the first acid aqueous solution 111, and then subjecting the semiconductor substrate 1 to etching treatment by the second acid aqueous solution 113.

When this was done, the first acid aqueous solution 111 was formulated by mixing a hydrofluoric acid aqueous solution having a mass concentration of 46% of hydrofluoric acid, a nitric acid aqueous solution having a mass concentration of 60% of nitric acid, and a sulfuric acid aqueous solution having a mass concentration of 95% of sulfuric acid. In this case, the volume ratio between the volume of the hydrofluoric acid aqueous solution having a mass concentration of 46% of hydrofluoric acid, the volume of the nitric acid aqueous solution having a mass concentration of 60% of nitric acid, and the volume of the sulfuric acid aqueous solution having a mass concentration of 95% of sulfuric acid that were mixed was made 1:3:10. The second acid aqueous solution 113 was formulated by mixing a hydrofluoric acid aqueous solution having a mass concentration of 46% of hydrofluoric acid, a nitric acid aqueous solution having a mass concentration of 60% of nitric acid, and water. In this case, the volume ratio of the hydrofluoric acid aqueous solution having a mass concentration 46% of hydrofluoric acid, the nitric acid aqueous solution having a mass concentration of 60% of nitric acid, and water that were mixed was made 3:12:7.

Vapor-phase thermal diffusion with $POCl_3$ made into a gas as the diffusion source was then used to form the second semiconductor layer 3 on the first main surface 1a side of the semiconductor substrate 1 on which the uneven part 1aL was formed. When this was done, the sheet resistance of the second semiconductor layer 3 was 70Ω/□. In this manner, the semiconductor substrate 1 including the first semiconductor layer 2 and the second semiconductor layer 3 was prepared.

The semiconductor substrate 1 obtained at this point was subjected to etching treatment by a hydrofluoric acid aqueous solution to remove the phosphorus glass, after which a silicon nitride film that will serve as the anti-reflection layer 5 was formed on the first main surface 1a by PECVD.

Additionally, after applying an aluminum paste over the entire surface of the second main surface 1b of the semiconductor substrate 1, the aluminum paste was fired so as to form the third semiconductor layer 4 and the second collector electrodes 7b. After applying of a silver paste onto the first main surface 1a and the second main surface 1b of the semiconductor substrate 1, the silver paste was fired so as form the first electrodes 6 and the second output lead-out electrodes 7a.

Finally, a laser was used to form a groove part in the periphery on the second main surface 1b side of the semiconductor substrate 1 to provide p-n isolation, thereby forming a solar cell element.

In this case, a sample number 1 of solar cell element in which the uneven part 1aL was formed by the forming method of condition 1, a sample number 2 of solar cell element in which the uneven part 1aL was formed by the forming method of condition 2, and a sample number 3 of solar cell element in which the uneven part 1aL was formed by the forming method of condition 3 were fabricated.

Then, the output characteristics (short-circuit current $I_{sc}$, open-circuit voltage $V_{oc}$, fill factor FF, and conversion efficiency) of the sample numbers 1 to 3 solar cell elements were measured. The measurements of these output characteristics were performed, based on JIS C 8913, with AM (air mass) of 1.5 and also a light irradiance of 100 mW/cm². The measurement results are shown in Table 1.

A laser microscope (Keyence model VK-9500) was used to measure the profile (arithmetic mean roughness Ra, root mean square roughness RMS, and (surface area/area)) of uneven part 1aL of the solar cell element at five points. The lens magnification of the laser microscope was ×150, the surface area was the surface area occurring because of the uneven part 1aL on the semiconductor substrate, and the area was the area of the measured region.

TABLE 1

| Sample number | Short-circuit current density (mA/cm²) | Open-circuit voltage (mV) | Fill factor | Conversion efficiency (%) |
|---|---|---|---|---|
| 1 | 33.7 | 620 | 0.785 | 16.4 |
| 2 | 31.1 | 618 | 0.786 | 15.1 |
| 3 | 34.5 | 618 | 0.785 | 16.7 |

As shown in Table 1, compared with the solar cell elements of sample number 1 and sample number 2, the solar cell element of sample number 3 had a relatively high short-circuit current density and conversion efficiency.

In the profiles of the uneven part 1aL of the solar cell elements, in sample number 1, Ra was 1.140 μm or greater and 1.195 μm or less, RMS was 1.483 μm or greater and 1.555 μm or less, and (surface area/area) was 5.748 or higher and 5.809 or less. In sample number 2, Ra was 0.210 μm or greater and 0.233 μm or less, RMS was 0.251 μm or greater and 0.280 μm or less, and (surface area/area) was 1.188 or greater and 1.219 or less. In sample number 3, Ra was 0.913 μm or greater and 0.994 μm or less, RMS was 1.182 μm or greater and 1.280 μm or less, and (surface area/area) was 5.361 or greater and 5.410 or less. It is thought that the increase in the short-circuit current density and conversion efficiency of these solar cell elements was caused by a reduction in the reflection of light by the formation of a preferred uneven part 1aL.

(B) Second Example

A second example of the method for manufacturing the solar cell element 10 according to an embodiment is described below. The referenced drawings are FIG. 1 to FIG. 3.

First, a polycrystalline silicon ingot was thinly sliced using a free abrasive type wire saw apparatus, to prepare a polycrystalline silicon substrate having a thickness of 220 μm, as a square sheet 156 mm on a side, and having a resistivity of 1.5 Ω·cm as the semiconductor substrate 1. The surface of the polycrystalline silicon substrate was then washed.

Next, an uneven part 1aL was formed on the first main surface 1a of the semiconductor substrate 1. The uneven part 1aL was formed by four forming methods having the following conditions A to D.

[A] In the forming method of condition A, the semiconductor substrate 1 was subjected to treatment by a mixed acid aqueous solution containing hydrofluoric acid and nitric acid, by an alkaline aqueous solution substantially made of a sodium hydroxide aqueous solution, and by an acid aqueous solution substantially made of a hydrofluoric acid aqueous solution, in this sequence. In this case, the mixed acid aqueous solution was formulated by mixing a hydrofluoric acid aqueous solution having a mass concentration of 46% of hydrofluoric acid, a nitric acid aqueous solution having a mass concentration of 60% of nitric acid, and water. In this case, the volume ratio between the volume of the hydrofluoric acid aqueous solution having a mass concentration of 46% of hydrofluoric acid, the volume of the nitric acid aqueous solution having a mass concentration of 60% of nitric acid, and the volume of water that were mixed was made 3:12:7. The mass concentration of the hydrofluoric acid in the acid aqueous solution made substantially of hydrofluoric acid aqueous solution was made 5%.

[B] In the forming method of condition B, the semiconductor substrate 1 was subjected to treating by mixed acid aqueous solution containing hydrofluoric acid and nitric acid, by alkaline aqueous solution substantially made of a sodium hydroxide aqueous solution, and by an acid aqueous solution substantially made of a hydrofluoric acid aqueous solution and a hydrochloric acid aqueous solution, in this sequence. In this case, the mixed acid aqueous solution used was the same as that of condition A. The acid aqueous solution substantially made of a hydrofluoric acid aqueous solution and a hydrochloric acid aqueous solution was formulated by mixing a hydrofluoric acid aqueous solution having a mass concentration 49% of hydrofluoric acid, a hydrochloric acid aqueous solution having a mass concentration of 35% of hydrochloric acid, and water. In this case, the volume ratio of the hydrofluoric acid aqueous solution having a mass concentration 49% of hydrofluoric acid, the hydrochloric acid aqueous solution having a mass concentration of 35% of hydrochloric acid, and water that were mixed was made 1:0.08:10.

[C] In the forming method of the condition C, the semiconductor substrate 1 was subjected to treatment by RIE in which $SF_6$ gas, $Cl_2$ gas, and $O_2$ gas are used as an etching gas, and by an acid aqueous solution substantially made of hydrofluoric acid, in this sequence. In this case, the mass concentration of the hydrofluoric acid in the acid aqueous solution substantially made of hydrofluoric acid was made 16%.

[D] In the forming method of condition D, the semiconductor substrate 1 was subjected to treatment by RIE in which $SF_6$ gas, $Cl_2$ gas and $O_2$ gas are used as an etching gas, and by an acid aqueous solution substantially made of a hydrofluoric acid aqueous solution and a hydrochloric acid aqueous solution, in this sequence. The mixed acid aqueous solution substantially made of a hydrofluoric acid aqueous solution and a hydrochloric acid aqueous solution was formulated by mixing a hydrofluoric acid aqueous solution having a mass concentration of 49% of hydrofluoric acid, a hydrochloric acid aqueous solution having a mass concentration of 35% of hydrochloric acid, and water. In this case, the volume ratio between the volume of the hydrofluoric acid aqueous solution having a mass concentration of 49% of hydrofluoric acid, the volume of the hydrochloric acid aqueous solution having a mass concentration of 35% of hydrochloric acid, and the volume of water that were mixed was made 1:0.08:2.

Vapor-phase thermal diffusion with $POCl_3$ made into a gas as the diffusion source was then used to form the second semiconductor layer 3 on the first main surface 1a side of the semiconductor substrate 1 on which the uneven part 1aL was formed. When this was done, the sheet resistance of the second semiconductor layer 3 was 70Ω/□. In this manner, the semiconductor substrate 1 including the first semiconductor layer 2 and the second semiconductor layer 3 was prepared.

The phosphorus glass as a glass layer that was formed on the surface of the semiconductor substrate 1 obtained at this point was removed by etching treatment. The phosphorus glass was removed by two removing methods having next conditions a and b.

[a] In the removing method of condition a, the phosphorus glass as a glass layer was removed by etching treatment using a first mixed acid aqueous solution substantially containing a hydrofluoric acid aqueous solution and a hydrochloric acid aqueous solution. In this case, the first mixed acid aqueous solution was formulated by mixing a hydrofluoric acid aqueous solution having a mass concentration of 49% of hydrofluoric acid, a hydrochloric acid aqueous solution having a mass concentration of 35% of hydrochloric acid, and water. In this case, the volume ratio between the volume of the hydrofluoric acid aqueous solution having a mass concentration of 49% of hydrofluoric acid, the volume of the hydrochloric acid aqueous solution having a mass concentration of 35% of hydrochloric acid, and the volume of water that were mixed was made 1:0.08:10.

[b] In the removing method of condition b, the phosphorus glass as a glass layer was removed by etching treatment using an acid aqueous solution substantially containing only a hydrofluoric acid aqueous solution. In this case, the mass concentration of hydrofluoric acid in the acid aqueous solution substantially containing a hydrofluoric acid aqueous solution was 8%.

After the above, a silicon nitride film serving as the anti-reflection layer 5 was formed by PECVD on the first main surface 1a.

Additionally, after applying an aluminum paste over the entire surface of the second main surface 1b of the semiconductor substrate 1, the aluminum paste was fired so as to form the third semiconductor layer 4 and the second collector electrodes 7b. After applying a silver paste onto the first main surface 1a and the second main surface 1b of the semiconductor substrate 1, the silver paste was fired so as form the first electrodes 6 and the second output lead-out electrodes 7a.

Finally, a laser was used to form a groove part in the periphery of the second main surface 1b side of the semiconductor substrate 1 to provide p-n isolation, thereby forming the solar cell element.

In this case, a sample number 4 solar cell element was formed adapting the forming method of condition A and the removing method of condition a. A sample number 5 solar cell element was formed adapting the forming method of condition B and the removing method of condition a. A sample number 6 solar cell element was formed by adapting the forming method of condition C and the removing method of condition a. A sample number 7 solar cell element was formed by adapting the forming method of condition D and the removing method of condition a. A sample number 8 solar cell element was formed by adapting the forming method of condition A and the removing method of condition b. A sample number 9 solar cell element was formed by adapting the forming method of condition B and the removing method of condition b. A sample number 10 solar cell element was formed by adapting the forming method of condition C and the removing method of condition b. A sample number 11 solar cell element was formed by adapting the forming method of condition D and the removing method of condition b.

Then, the output characteristics (short-circuit current $I_{sc}$, open-circuit voltage $V_{oc}$, Fill factor FF, and conversion efficiency) of the sample numbers 4 to 11 solar cell elements were measured. The measurements of these output characteristics were performed, based on JIS C 8913, with AM (air mass) of 1.5 and also a light irradiance of 100 mW/cm². The measurement results are shown in Table 2 as comparison values for each sample number, compared with the output characteristics values of sample number 8, which were normalized to 1.

TABLE 2

| Sample number | Short-circuit current density | Open-circuit voltage | Fill factor | Conversion efficiency |
| --- | --- | --- | --- | --- |
| 4 | 1.007 | 1.004 | 1.001 | 1.012 |
| 5 | 1.008 | 1.005 | 1.003 | 1.016 |
| 6 | 1.055 | 0.984 | 0.975 | 1.012 |
| 7 | 1.058 | 0.986 | 0.977 | 1.019 |
| 8 | 1.000 | 1.000 | 1.000 | 1.000 |
| 9 | 1.001 | 0.998 | 1.001 | 1.000 |
| 10 | 1.048 | 0.982 | 0.975 | 1.003 |
| 11 | 1.050 | 0.981 | 0.973 | 1.002 |

As shown in Table 2, compared with the solar cell elements of sample numbers 8 to sample 11, the solar cell elements of sample numbers 4 to 7 had relatively high conversion efficiencies.

It is thought that this increase in the conversion efficiency is caused by the effect of using a first mixed acid aqueous solution substantially containing a hydrofluoric acid aqueous solution and a hydrochloric acid aqueous solution when the phosphoric glass was removed by etching treatment. Specifically, the efficiency of removal of metallic elements existing in the vicinity of the surface of the semiconductor substrate 1 increases by the hydrochloric acid and, as a result, it is thought that there was an effect whereby hydrochloric acid reduces the adhesion of metallic elements existing within an aqueous solution to the surface of the semiconductor substrate 1.

Furthermore, there was almost no increase in the conversion efficiency in the comparison of the solar cell elements of sample number 8 with those of sample number 9, and the comparison of the solar cell elements of sample number 10 with those of sample number 11.

In contrast, compared with the solar cell elements of sample number 4, the solar cell elements of sample number 5 achieved relatively high conversion efficiency, in the uneven part forming process, by treatment of the semiconductor substrate 1 by an acid aqueous solution substantially containing a hydrofluoric acid aqueous solution and an hydrochloric acid aqueous solution. Also, compared with the solar cell elements of sample number 6, the solar cell elements of sample number 7 achieved relatively high conversion efficiency, in the uneven part forming process in a similar manner, by treatment of the semiconductor substrate 1 by an acid aqueous solution substantially containing a hydrofluoric acid aqueous solution and a hydrochloric acid aqueous solution.

It is thought that these increases in the conversion efficiency were achieved by the removal of metallic elements adhered in the vicinity of the surface of the semiconductor substrate 1 at the time of processing by the aqueous solution or processing by RIE in the uneven part forming process, which is a process performed before the thermal diffusion in the semiconductor layer forming process. Specifically, it is thought that, in the processing by thermal diffusion at a high temperature, by metallic elements adhered in the vicinity of the surface of semiconductor substrate 1 being reduced by diffusion as impurities into the crystal of the semiconductor substrate 1, the conversion efficiency increased. It is further thought that then, in the sample number 5 and sample number 7 solar cell elements, after thermal diffusion in the semiconductor layer forming process, by further removal of metallic elements existing in the vicinity of the surface of the semiconductor substrate 1, the quality of the pn junction region improved dramatically, thereby achieving a high conversion efficiency.

The sample number 7 solar cell elements, compared to the sample number 6 solar cell elements, had relatively high conversion efficiencies. One factor in improving the output characteristics is thought to be that, as a result of the effective removal of the oxide film formed on the uneven part 1aL by the acid aqueous solution substantially constituted by a hydrofluoric acid aqueous solution and a hydrochloric acid aqueous solution, there was a great improvement in the water repellency at the first main surface 1a of the semiconductor substrate 1. Specifically, it is thought that one factor in the improvement of the output characteristics is that, by a great improvement in the water repellency at the first main surface 1a of the semiconductor substrate 1, the unevenness in the dopant diffusion in the semiconductor substrate 1 at the time of thermal diffusion in the semiconductor layer forming step greatly improved.

DESCRIPTIONS OF THE REFERENCE SYMBOLS

1 Semiconductor substrate
1a, 10a First main surface
1b, 10b Second main surface
1aL Uneven part
2 First semiconductor layer
3 Second semiconductor layer 4 Third semiconductor layer
5 Anti-reflection layer
6 First electrode
6a First output lead-out electrode
6b First collector electrode
7 Second electrode
7a Second output lead-out electrode
7b Section collector electrode
10 Solar cell element

The invention claimed is:

1. A method for manufacturing a solar cell element, the method comprising:
   etching a first main surface of a semiconductor substrate having a first conductivity type, using a first acid aqueous solution containing hydrofluoric acid, nitric acid, and sulfuric acid to obtain a first etched surface;
   etching the first etched surface using a second acid aqueous solution containing hydrofluoric acid and nitric acid with substantially no sulfuric acid to obtain a second etched surface having an uneven surface; and
   forming a semiconductor layer on at least a part of the second etched surface, the layer having a second conductivity type different from the first conductivity type.

2. The method according to claim 1, wherein the second acid aqueous solution has a temperature lower than that of the first acid aqueous solution.

3. The method according to claim 1, wherein the second acid aqueous solution has a mass ratio of the nitric acid to the hydrofluoric acid higher than that of the first acid aqueous solution.

4. The method according to claim 1, further comprising:
   washing the first etched surface with water for a first period of time; and
   washing the second etched surface with water for a second period of time longer than the first period.

5. The method according to claim 1, wherein the substrate is immersed in the first acid aqueous solution with the first main surface substantially perpendicular to a fluid surface of the first acid aqueous solution.

6. The method according to claim 1, further comprising preparing the substrate by slicing an ingot of a semiconductor material with a wire to which an abrasive is fixed.

* * * * *